(12) United States Patent
Miyazaki

(10) Patent No.: US 12,238,438 B2
(45) Date of Patent: Feb. 25, 2025

(54) IMAGING DEVICE AND METHOD OF DRIVING IMAGING DEVICE

(71) Applicant: SONY SEMICONDUCTOR SOLUTIONS CORPORATION, Kanagawa (JP)

(72) Inventor: Shinya Miyazaki, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 143 days.

(21) Appl. No.: 18/005,628

(22) PCT Filed: Jun. 24, 2021

(86) PCT No.: PCT/JP2021/024031
§ 371 (c)(1),
(2) Date: Jan. 16, 2023

(87) PCT Pub. No.: WO2022/024615
PCT Pub. Date: Feb. 3, 2022

(65) Prior Publication Data
US 2023/0283924 A1 Sep. 7, 2023

(30) Foreign Application Priority Data
Jul. 27, 2020 (JP) .................... 2020-126719

(51) Int. Cl.
*H04N 25/75* (2023.01)
*H01L 27/146* (2006.01)
*H04N 25/773* (2023.01)

(52) U.S. Cl.
CPC ....... *H04N 25/75* (2023.01); *H01L 27/14614* (2013.01); *H04N 25/773* (2023.01)

(58) Field of Classification Search
None
See application file for complete search history.

(56) References Cited

U.S. PATENT DOCUMENTS 5,270,531 A * 12/1993 Yonemoto ............... H04N 25/76
348/E3.018
6,801,256 B1 * 10/2004 Egawa ................... H04N 25/76
348/300
(Continued)

FOREIGN PATENT DOCUMENTS

JP 2011-097540 A 5/2011
JP 2014-057367 A 3/2014
(Continued)

OTHER PUBLICATIONS

International Search Report and Written Opinion of PCT Application No. PCT/JP2021/024031, issued on Aug. 31, 2021, 08 pages of ISRWO.

Primary Examiner — Cynthia Segura
(74) Attorney, Agent, or Firm — CHIP LAW GROUP

(57) ABSTRACT

An imaging device according to an embodiment of the present disclosure includes a light-receiving pixel, a power supply, a driver, and a current circuit. The light-receiving pixel includes a light-receiving element and a pixel transistor. The light-receiving element generates electric charge corresponding to an amount of received light. The power supply generates a first power supply voltage at a first power supply node. The driver drives the pixel transistor on the basis of the first power supply voltage at the first power supply node. The current circuit causes a power supply current to flow through a current path led to the first power supply node. The power supply current has a predetermined current value. The current circuit includes a load, a load driving section, and a switch. The load driving section drives the load. The switch is provided on the current path. The switch allows the power supply current to flow through the current path by being turned on in a period in which a voltage in the load changes by a predetermined voltage.

18 Claims, 23 Drawing Sheets

(56) References Cited

U.S. PATENT DOCUMENTS

| | | | | |
|---|---|---|---|---|
| 9,025,056 B2* | 5/2015 | Ebihara | ................ | H04N 25/621 |
| | | | | 348/245 |
| 2008/0211951 A1* | 9/2008 | Wakabayashi | ....... | H04N 25/618 |
| | | | | 348/308 |
| 2012/0228476 A1* | 9/2012 | Muroshima | ....... | H01L 27/14609 |
| | | | | 250/208.1 |
| 2014/0002703 A1* | 1/2014 | Ebihara | ................ | H04N 25/531 |
| | | | | 348/296 |
| 2024/0155103 A1* | 5/2024 | Wang | ..................... | H04N 25/78 |

FOREIGN PATENT DOCUMENTS

| | | | |
|---|---|---|---|
| JP | 2016-201649 A | 12/2016 | |
| JP | 2018-182496 A | 11/2018 | |

* cited by examiner

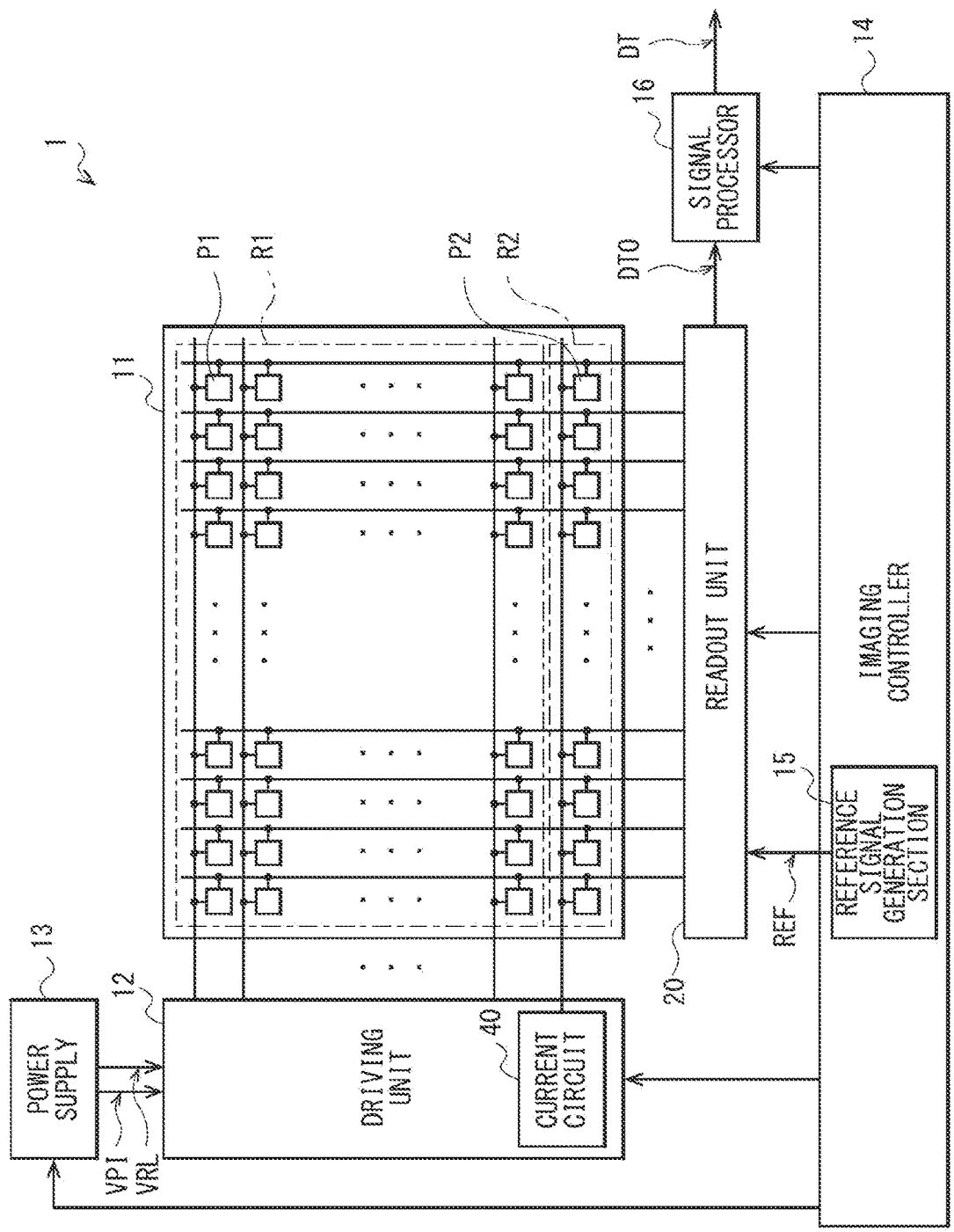
[FIG. 1]

[FIG. 2]
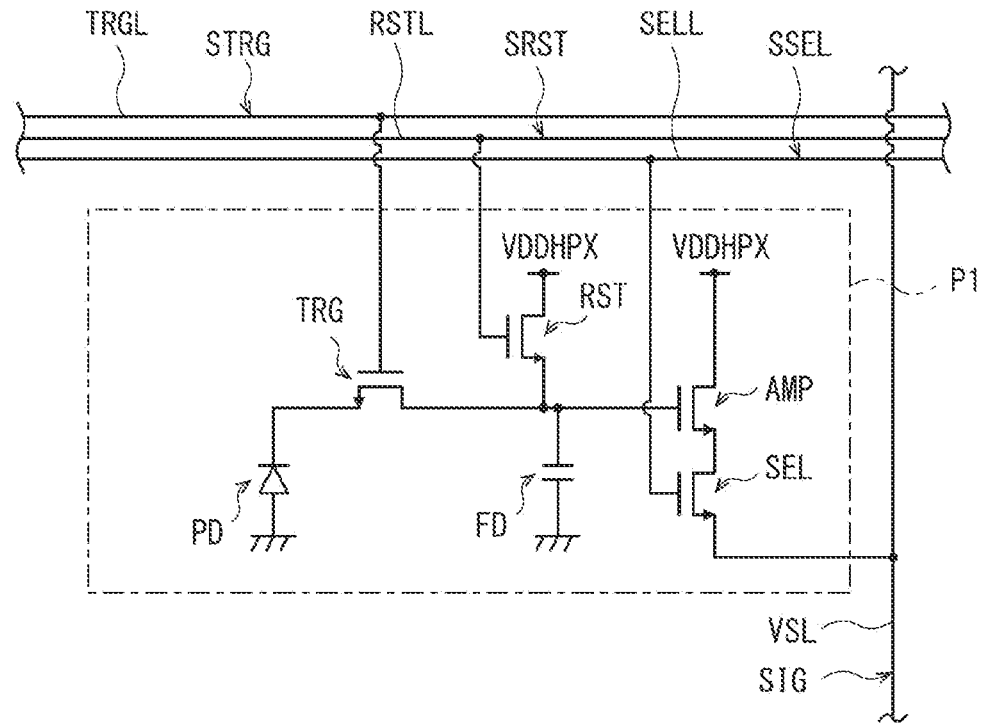
[FIG. 3]
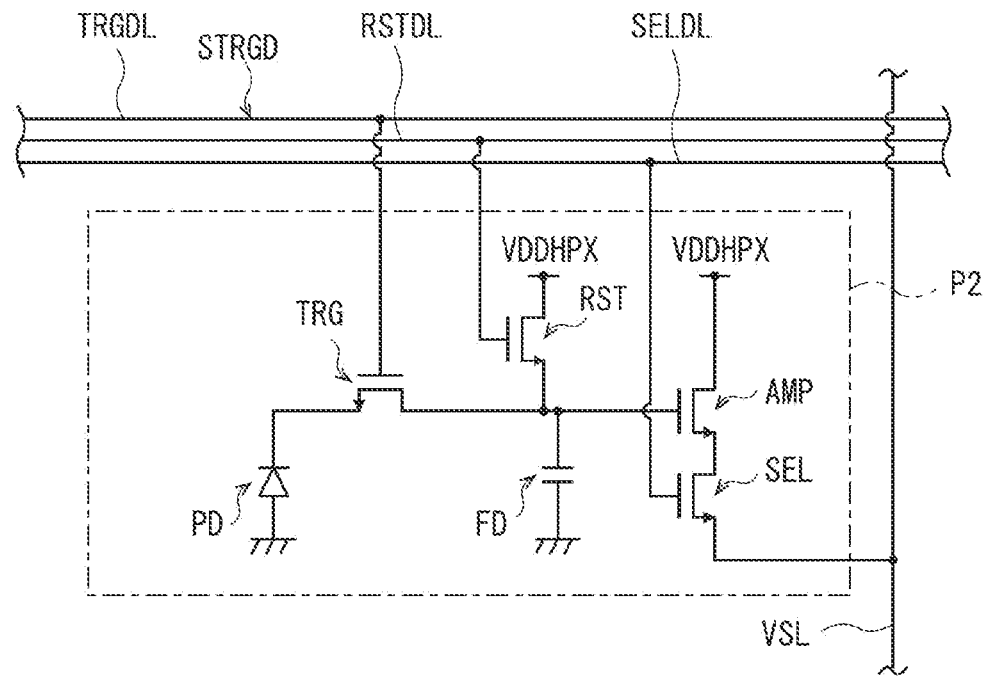

[FIG. 4]
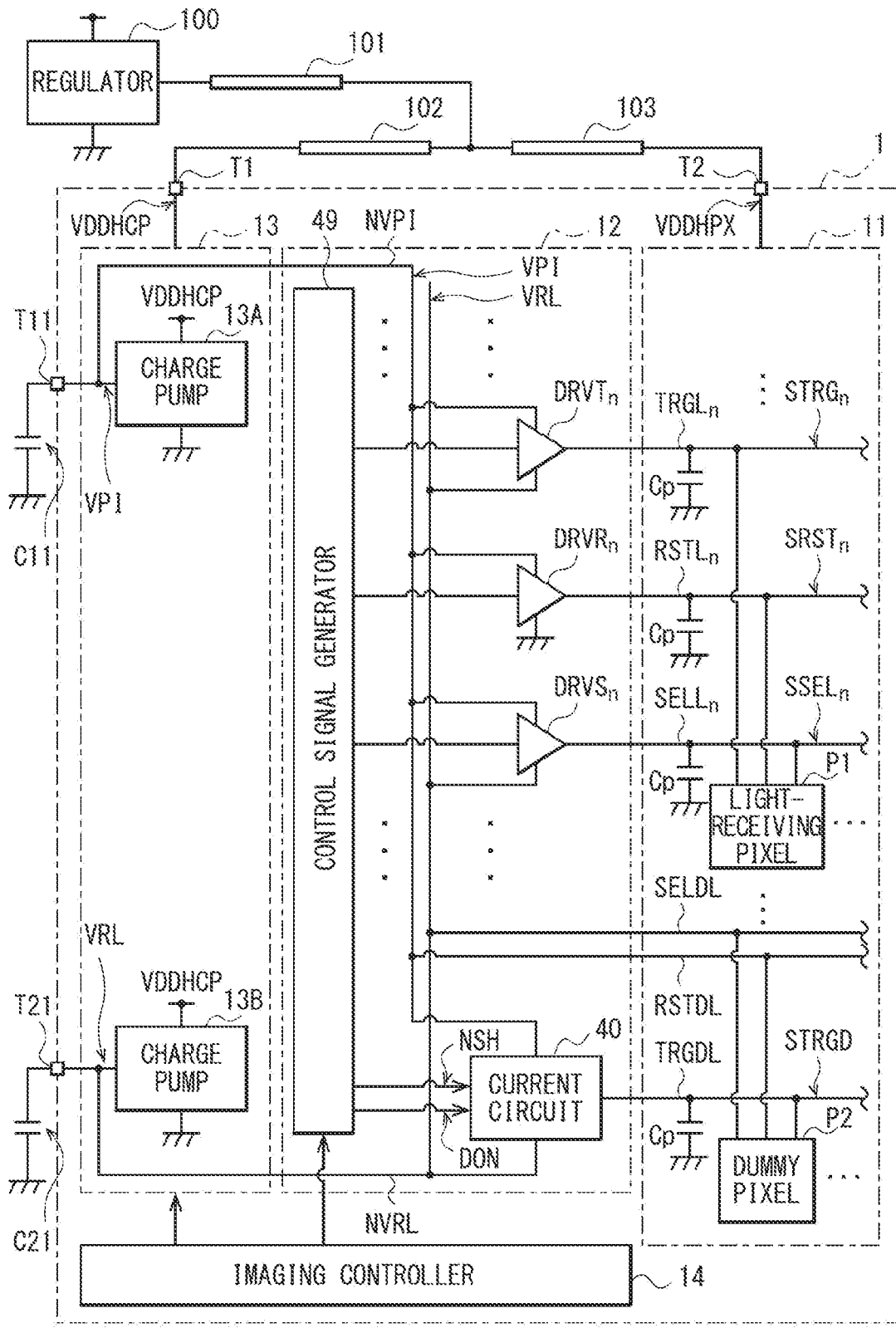

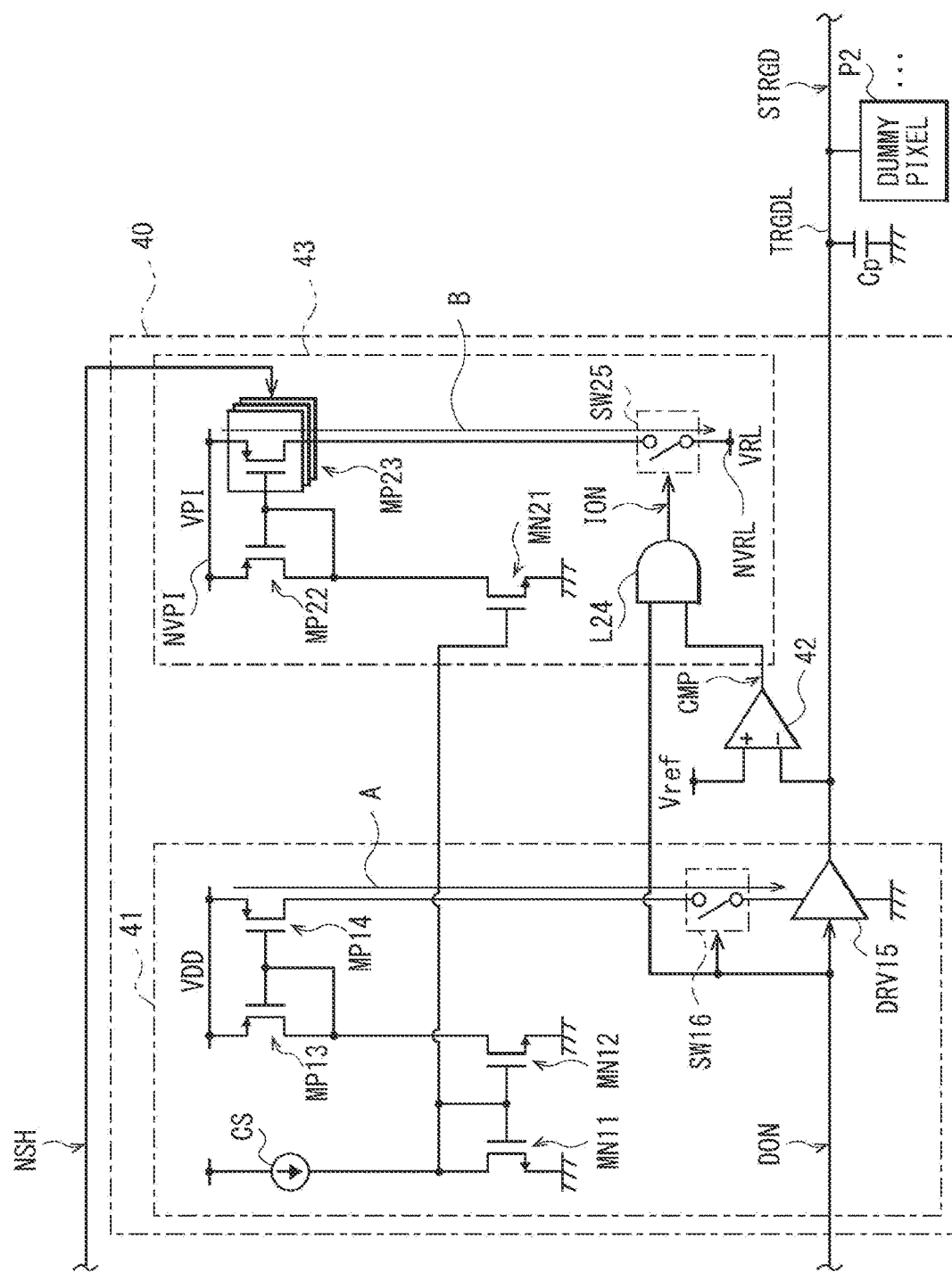
[FIG. 5]

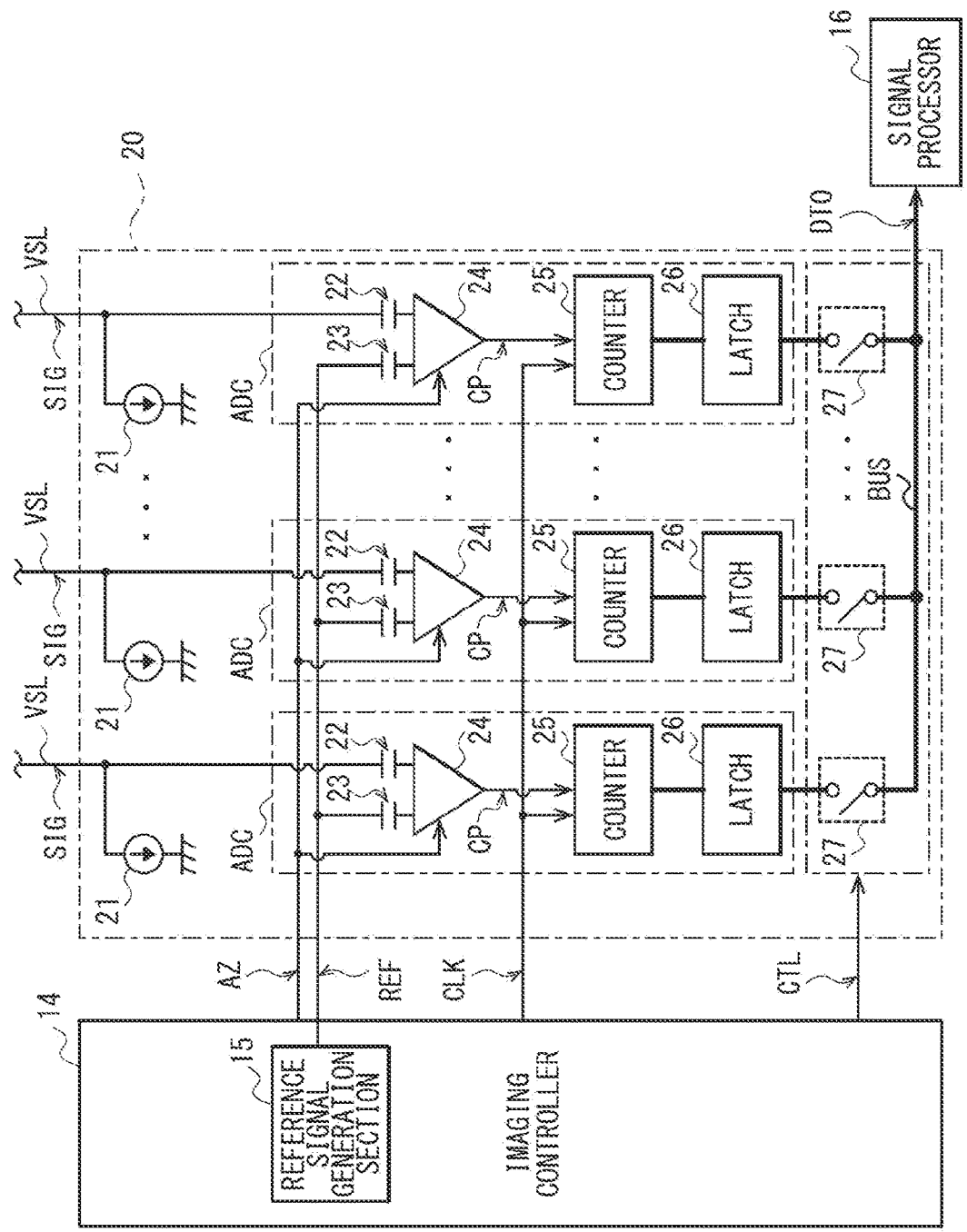
[FIG. 6]

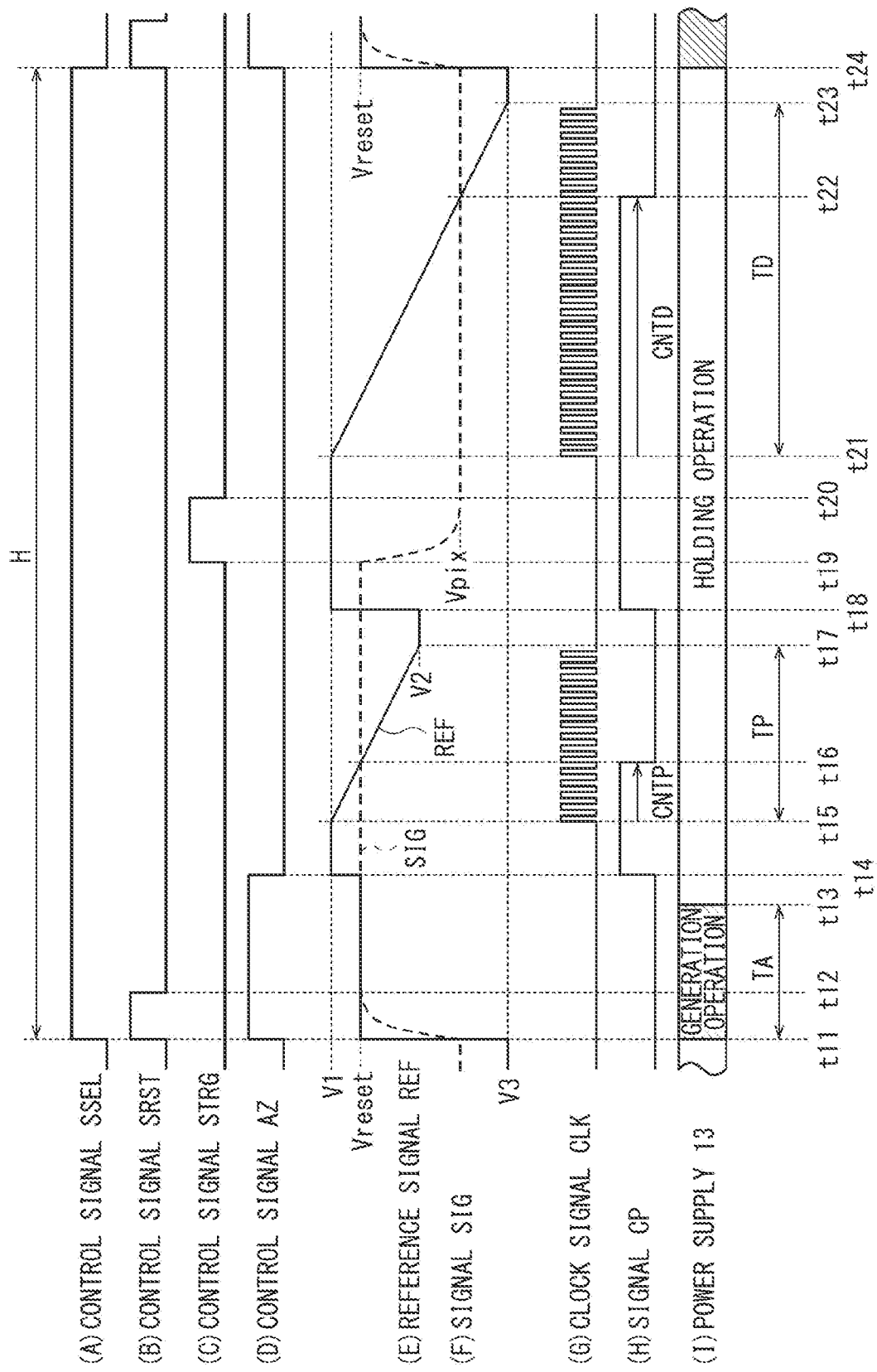

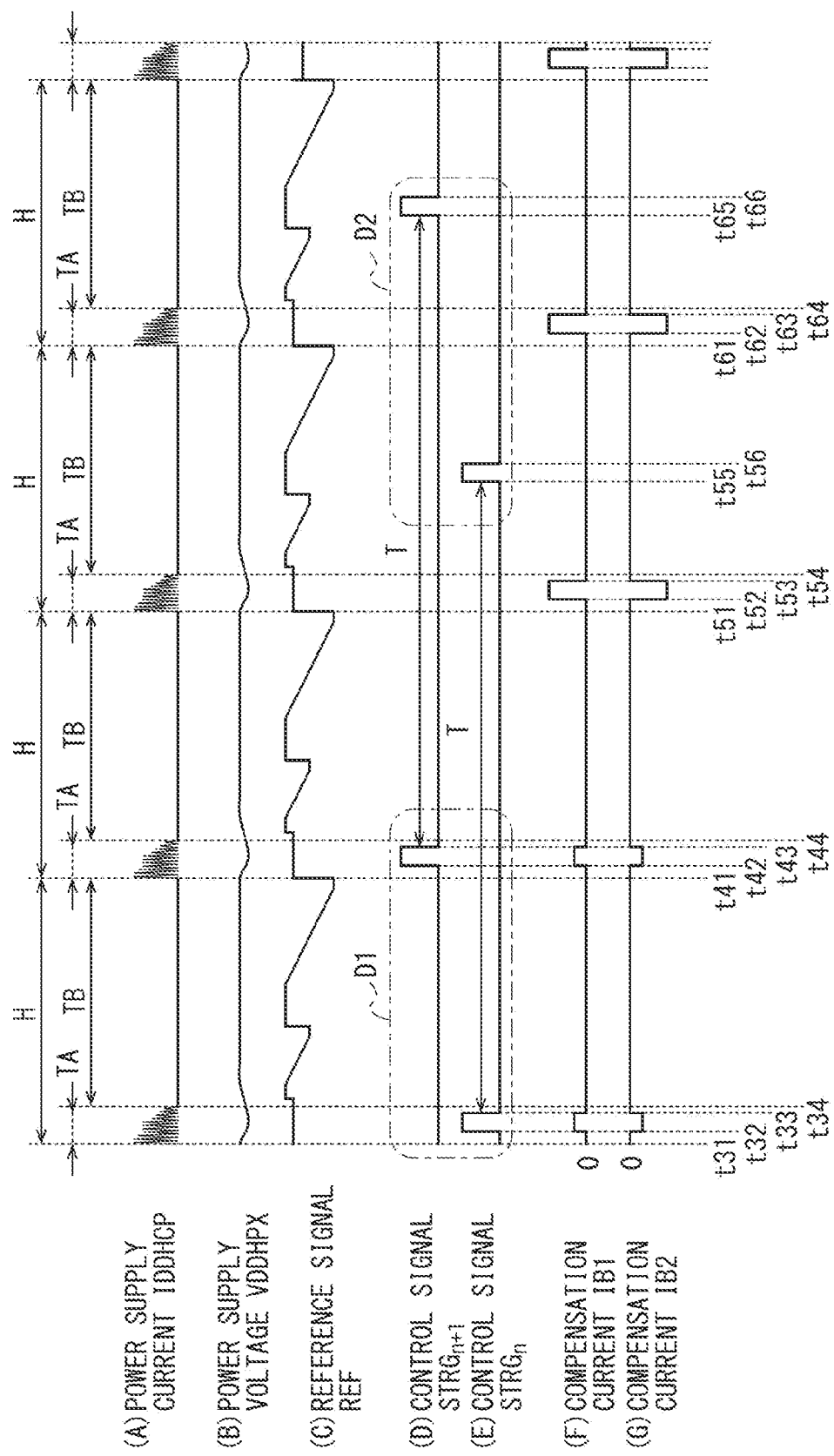
[FIG. 8]

[FIG. 9]
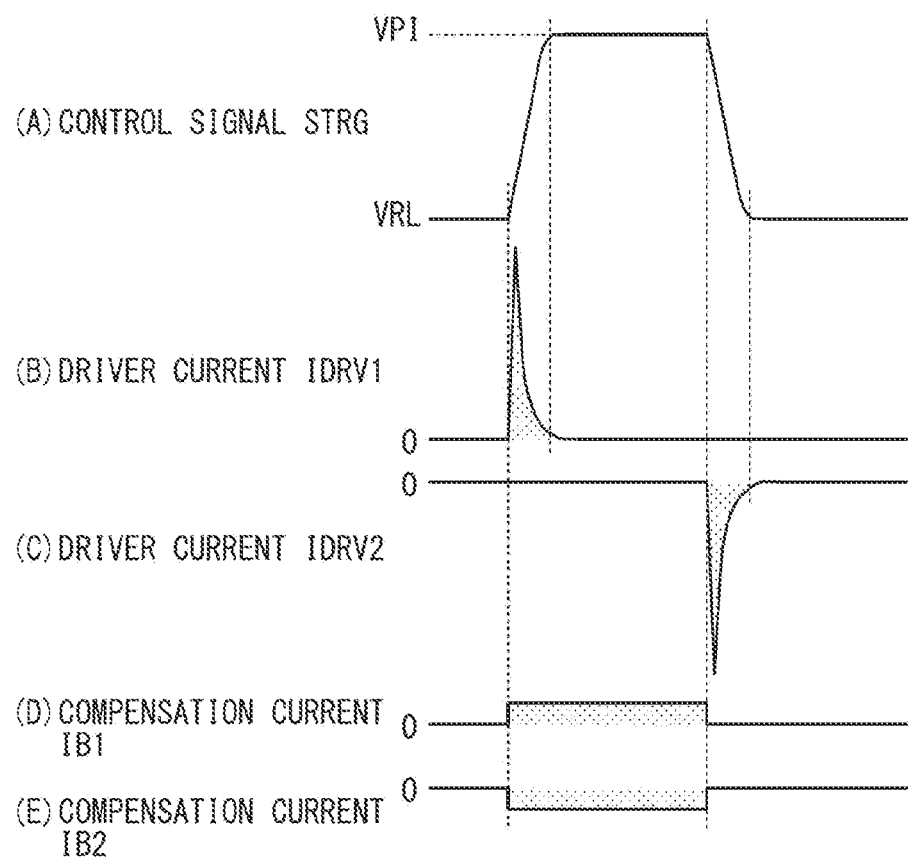

[FIG. 10]
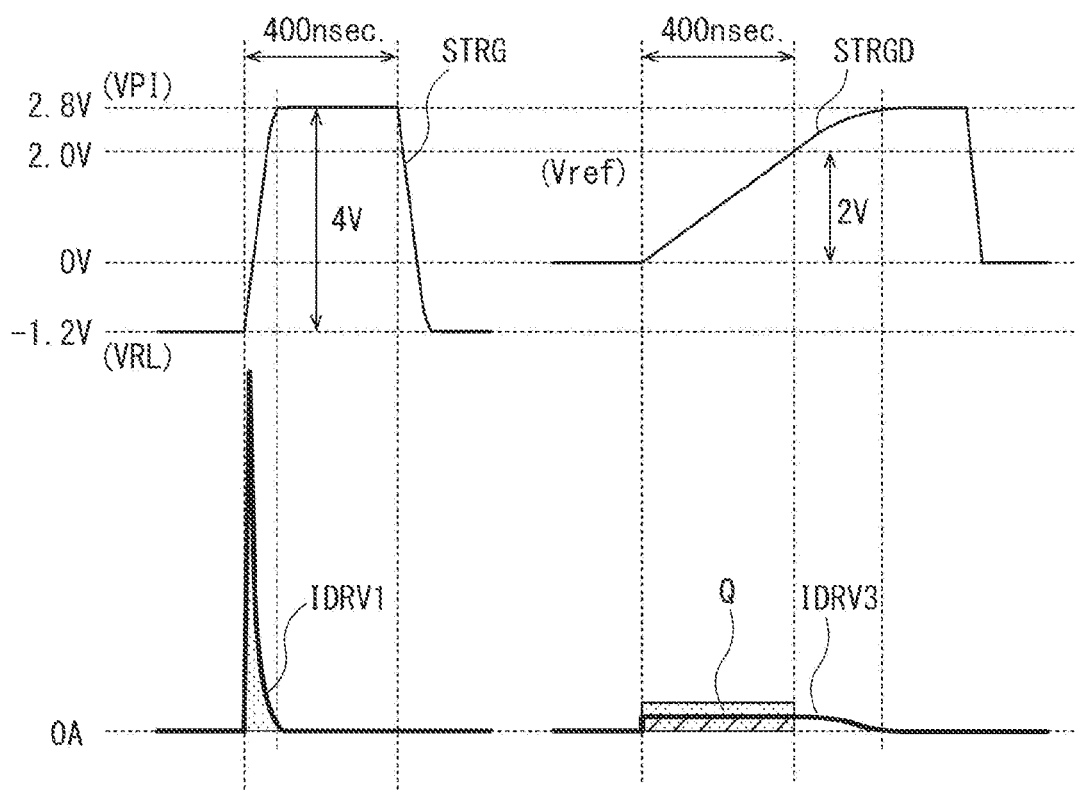

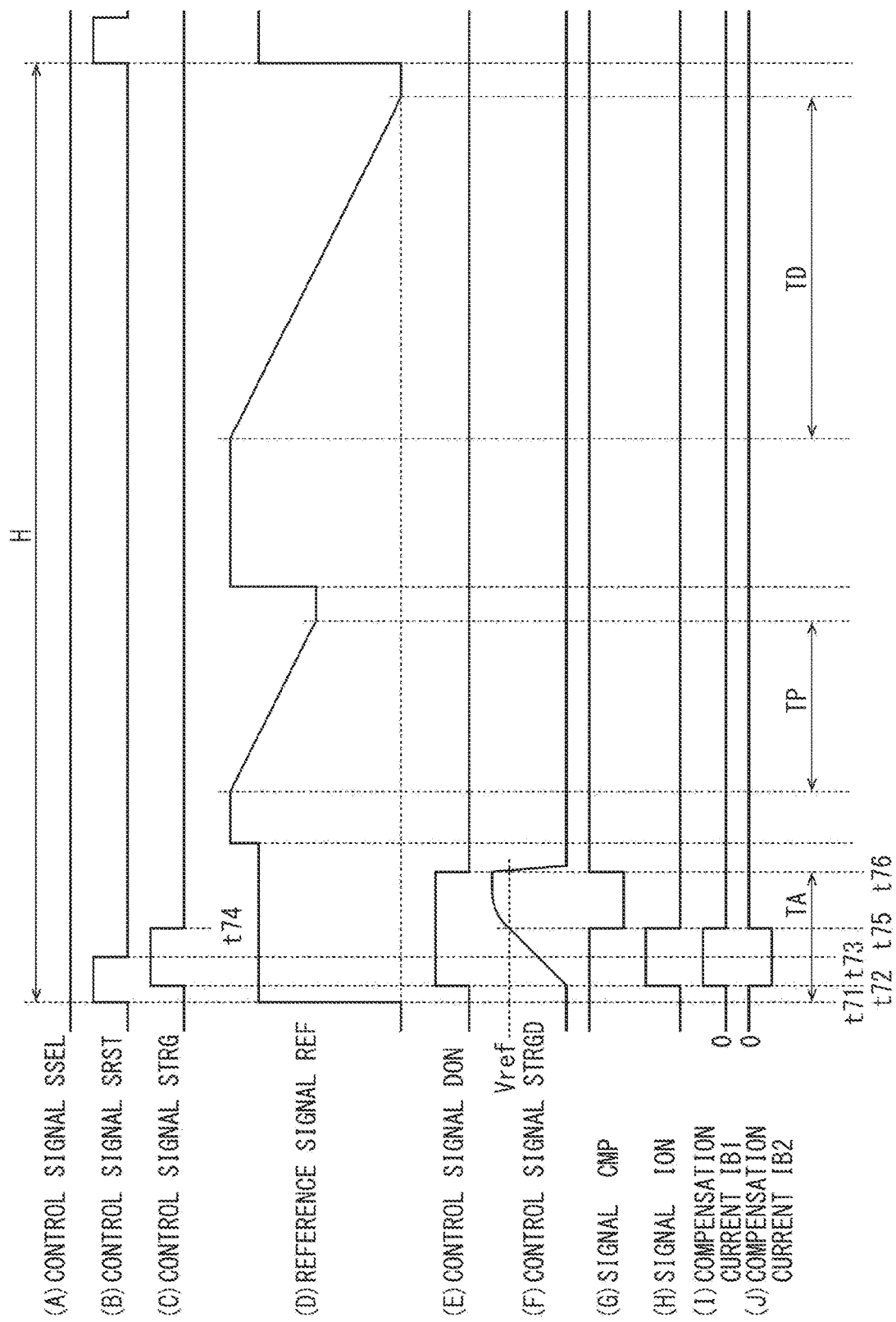

[FIG. 12]
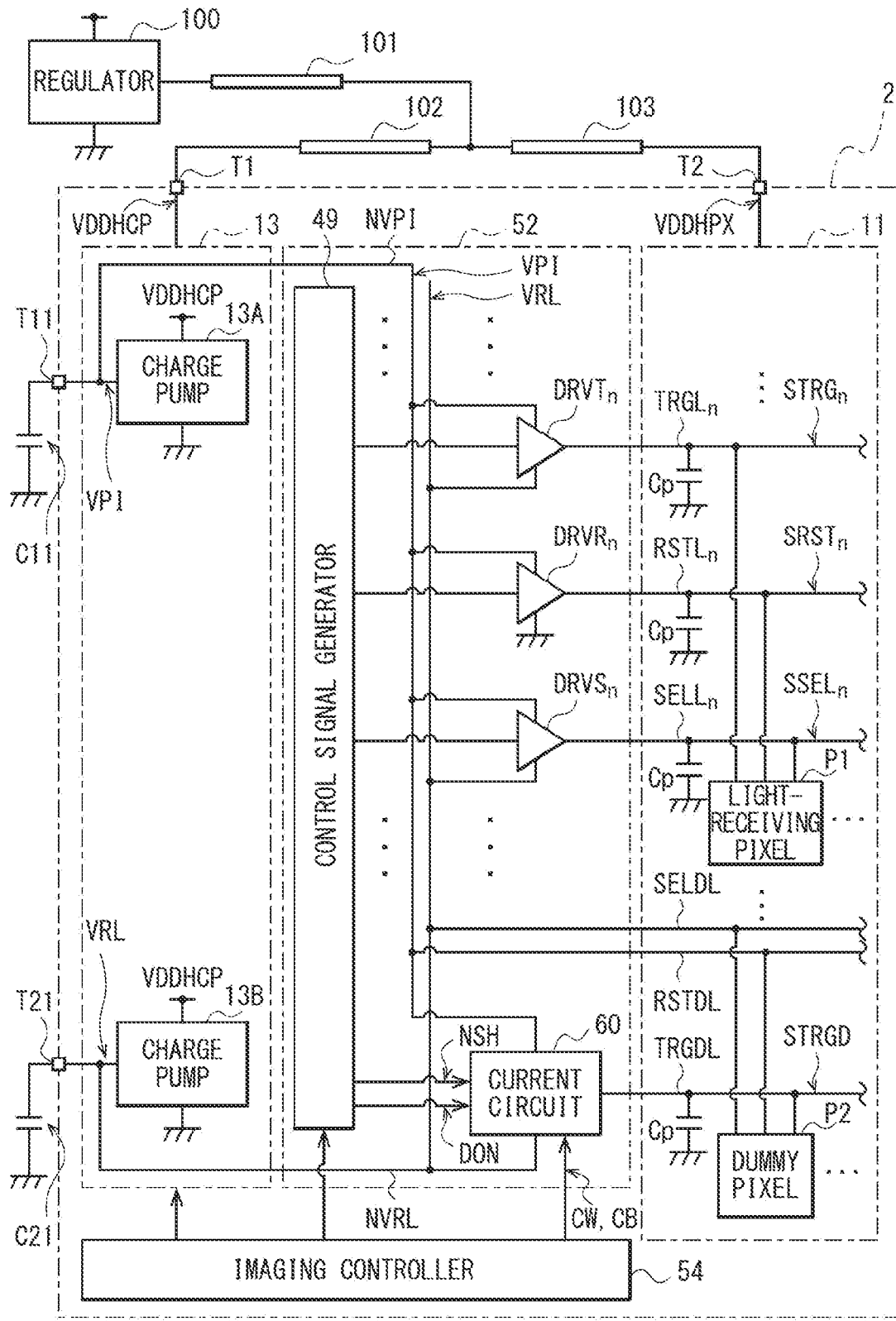

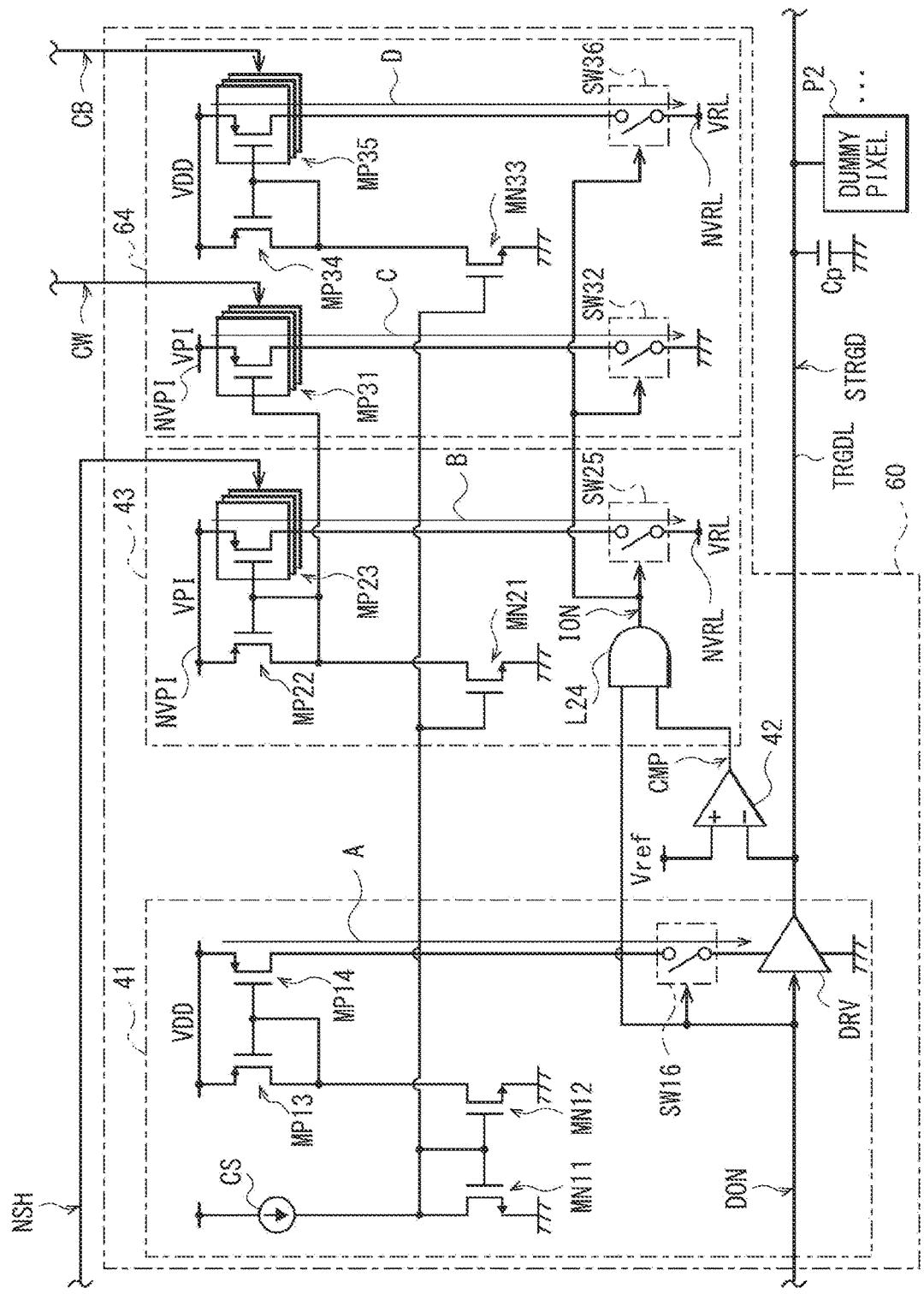
[FIG. 13]

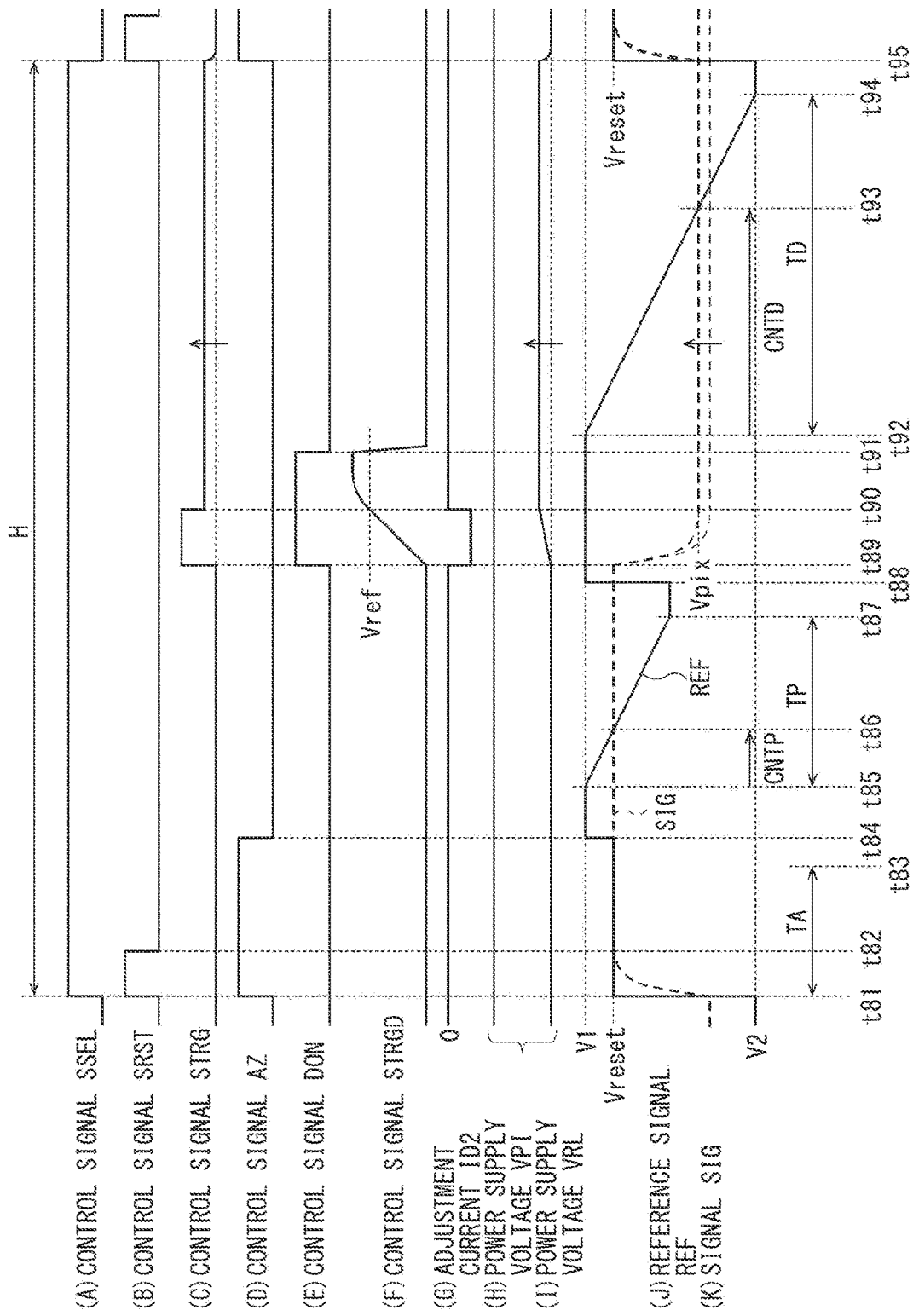

[FIG. 15]
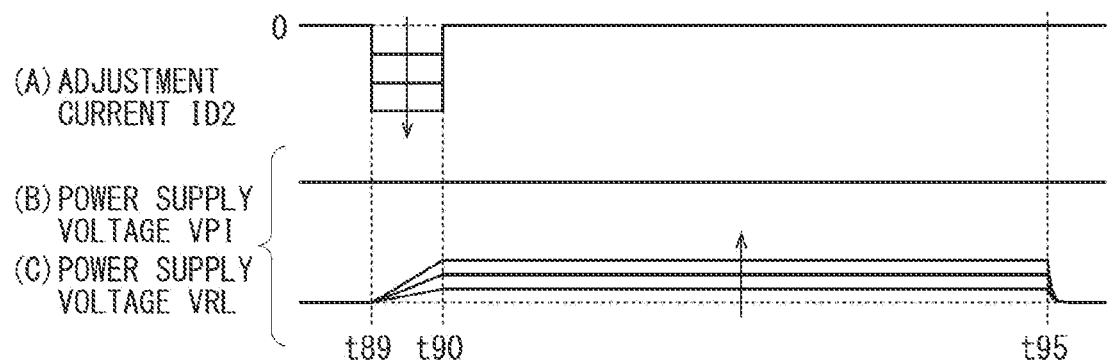
[FIG. 16]
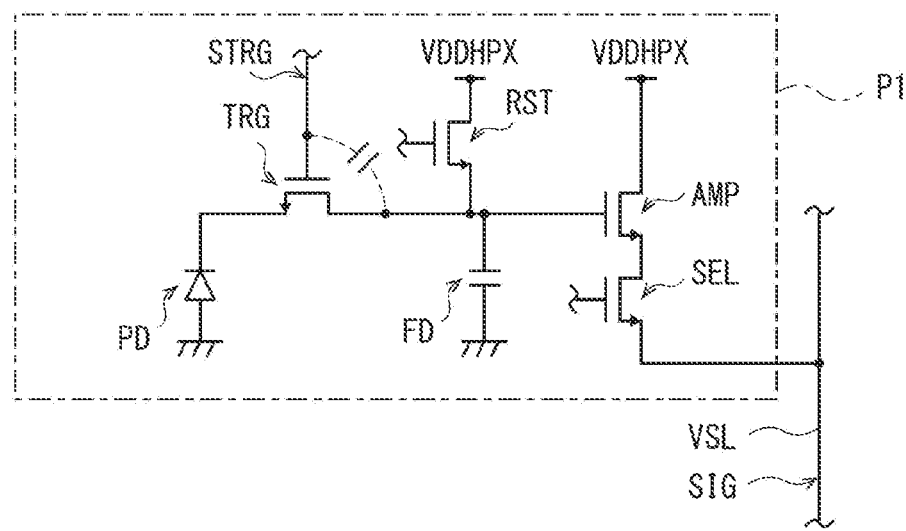

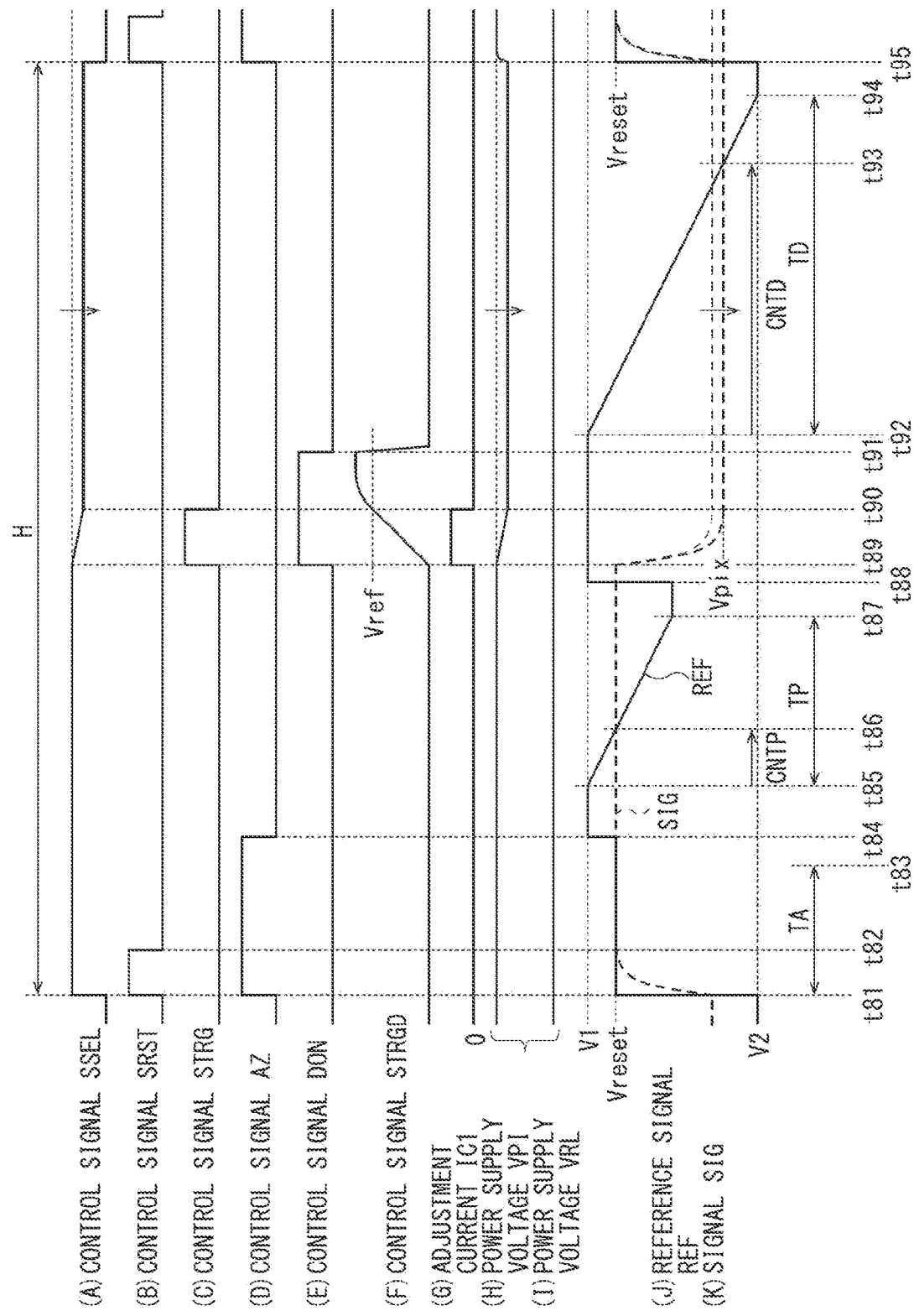

[FIG. 18]
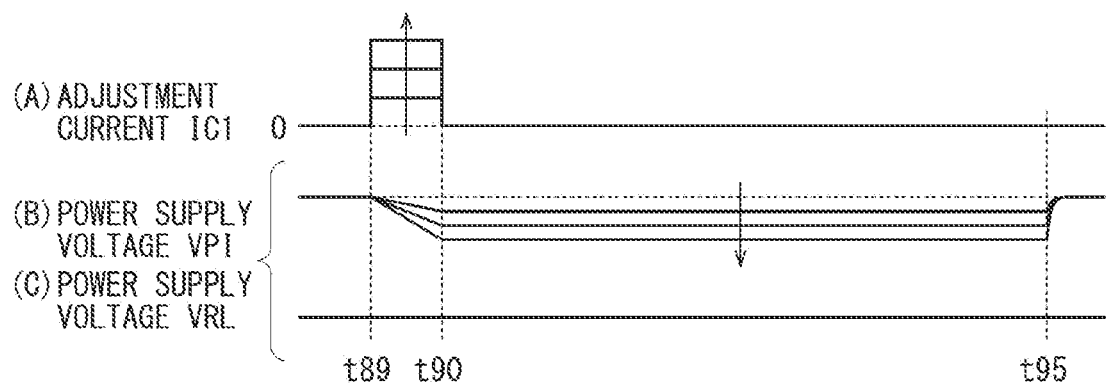
[FIG. 19]
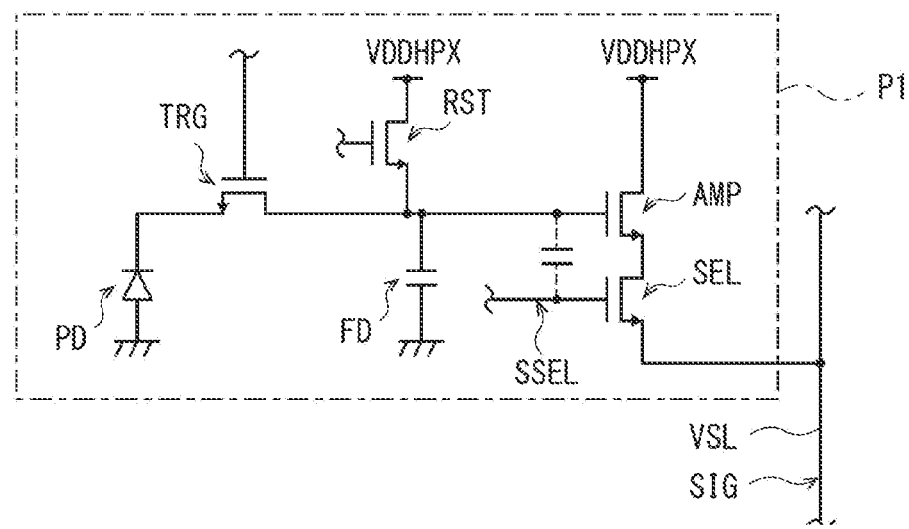

[FIG. 20]
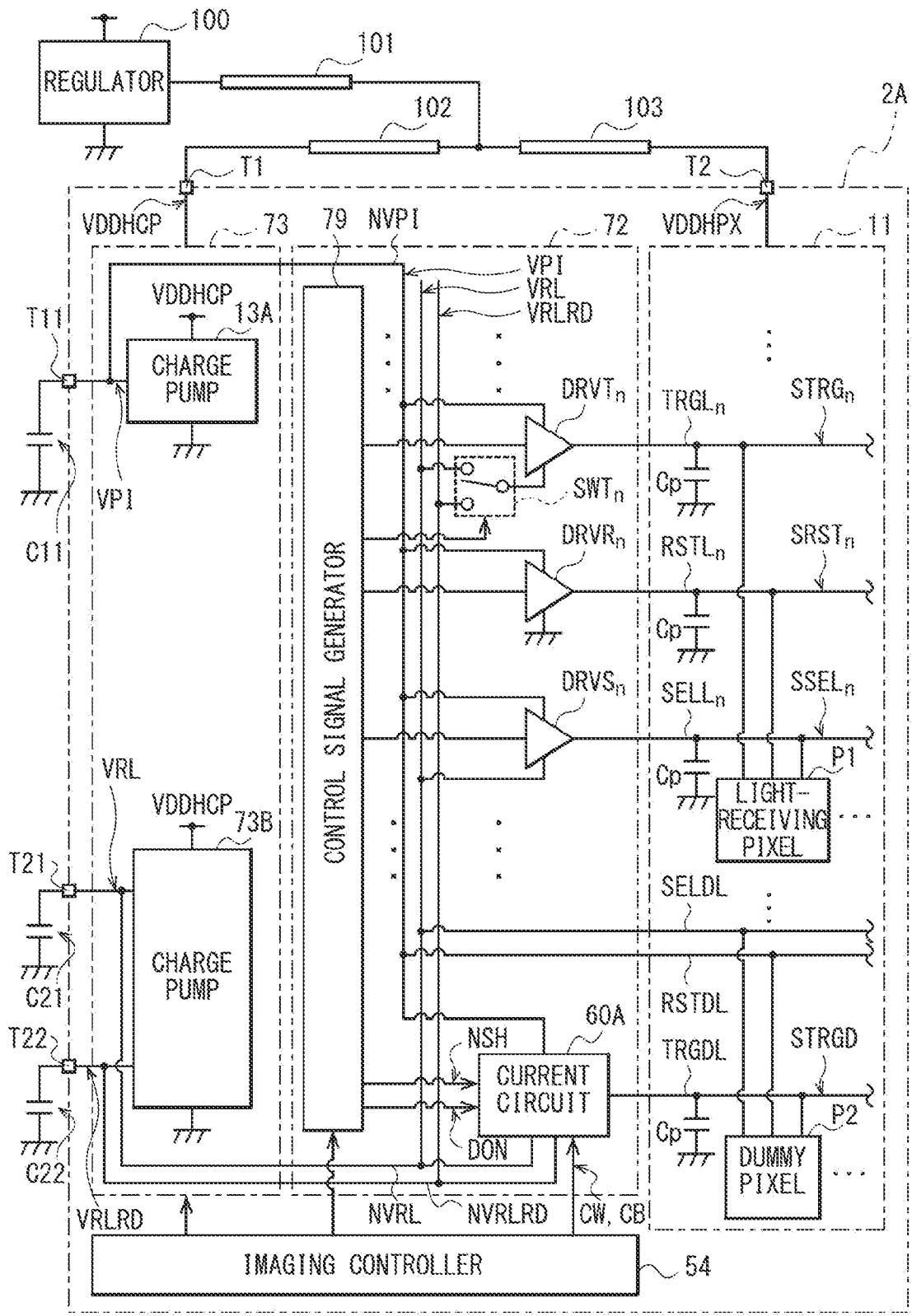

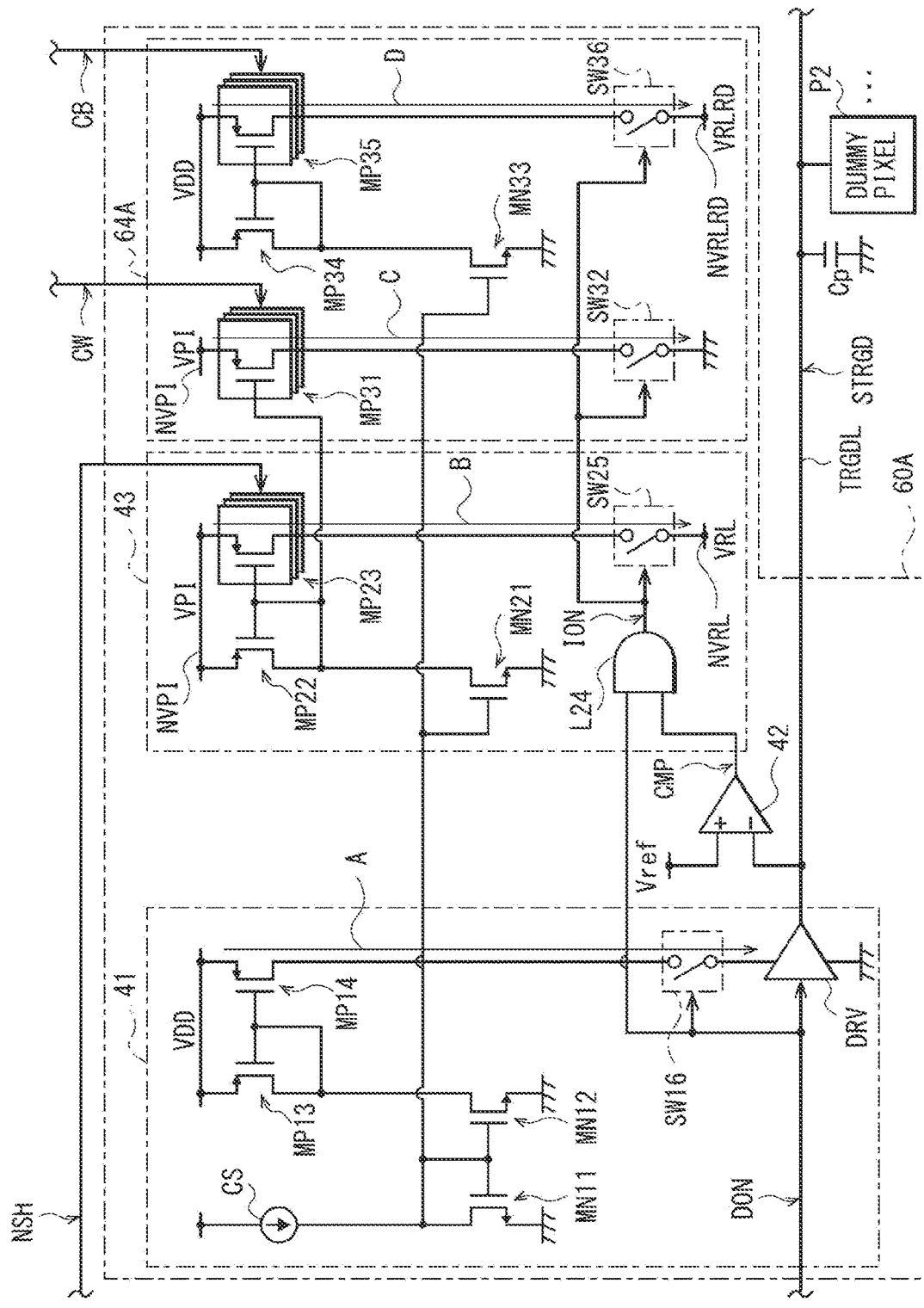
[FIG. 21]

[FIG. 22]
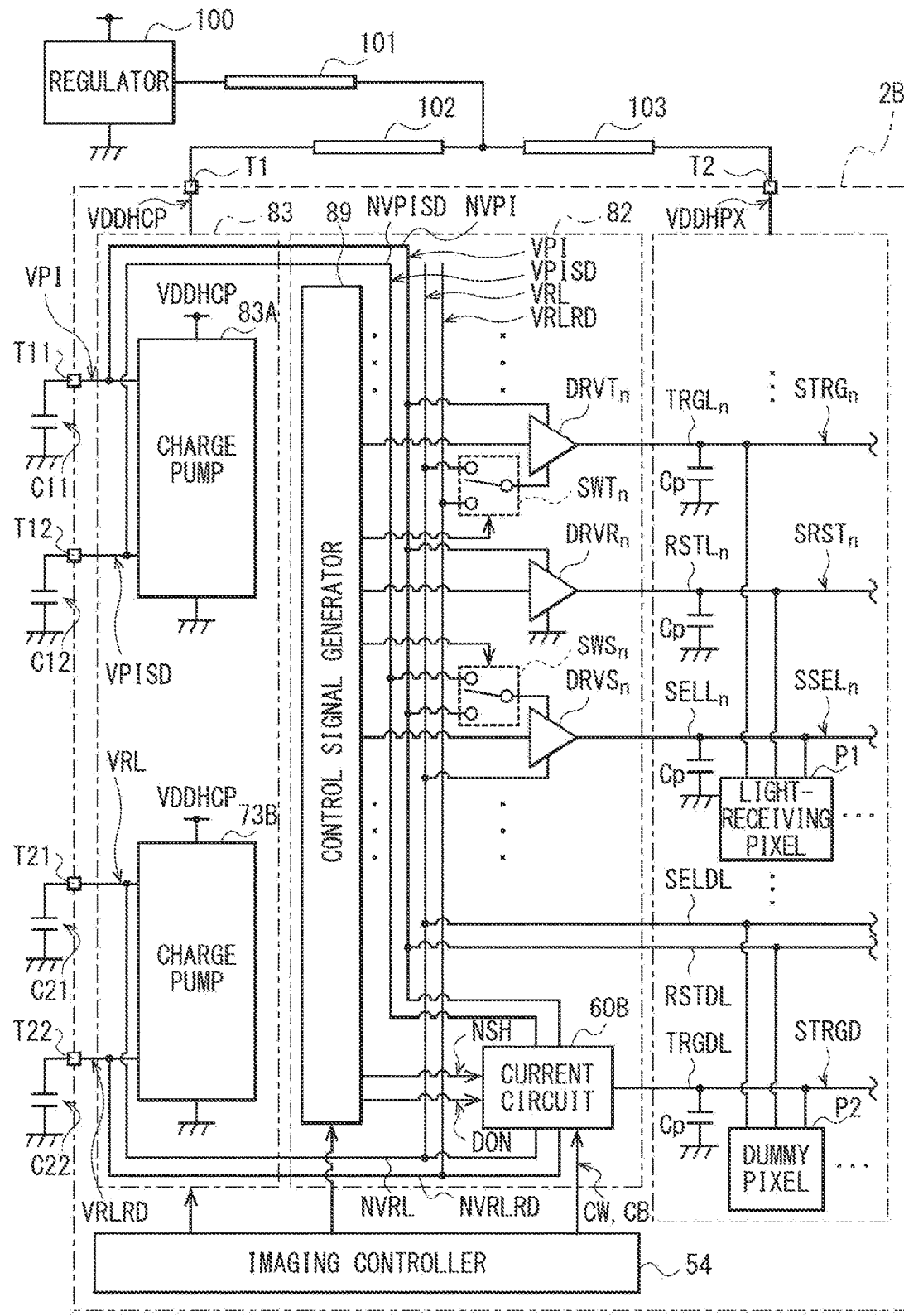

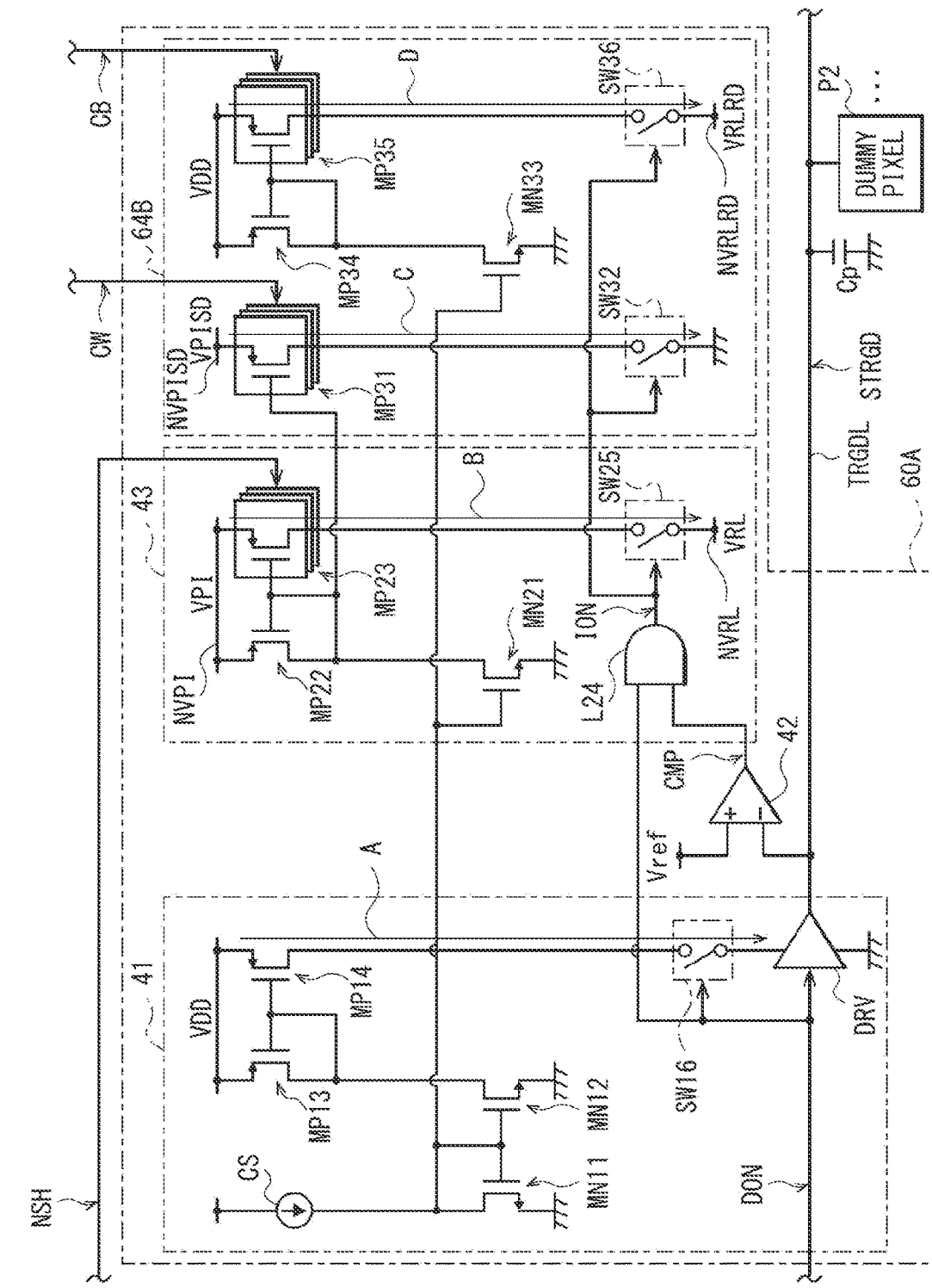
[FIG. 23]

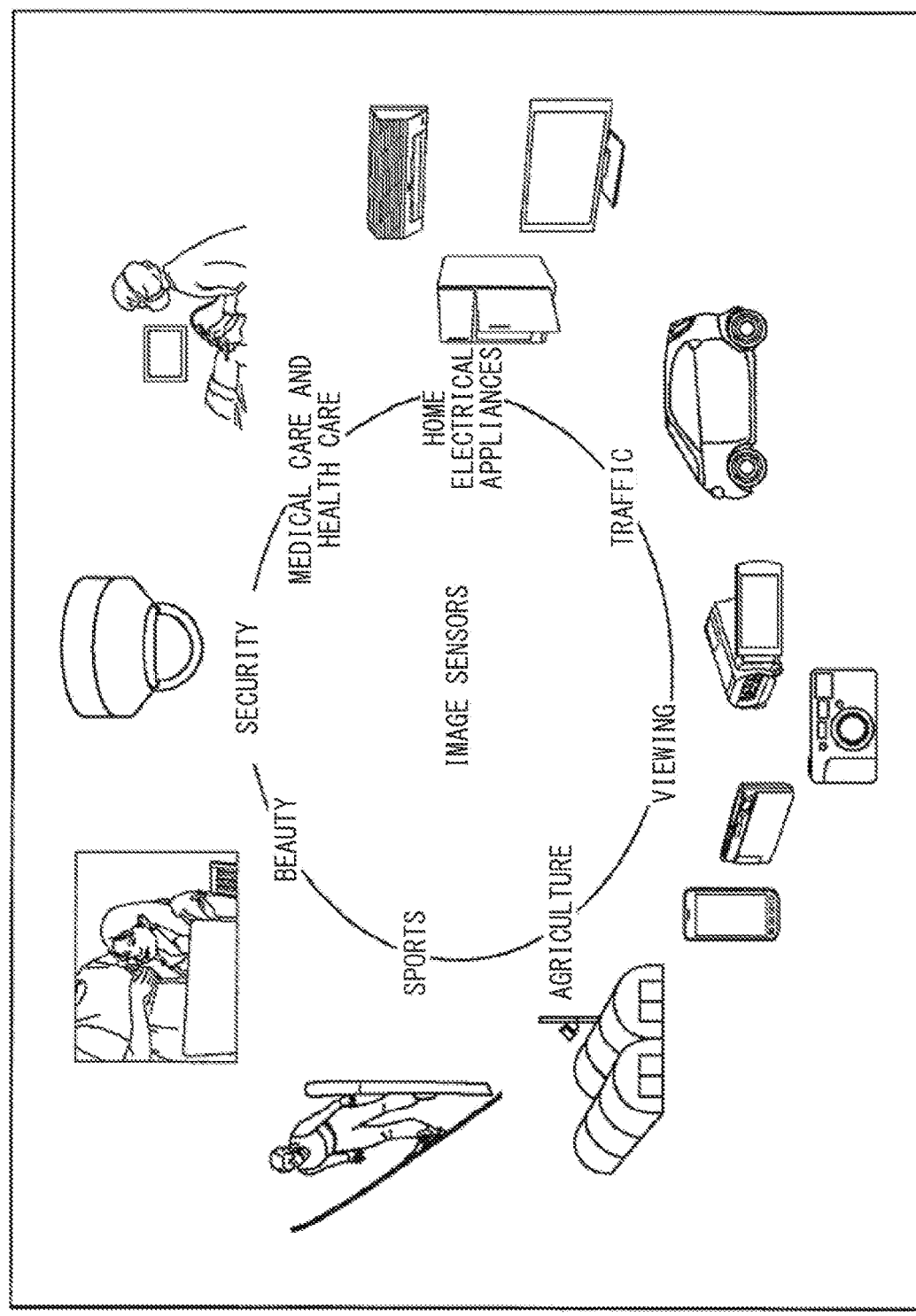
[FIG. 24]

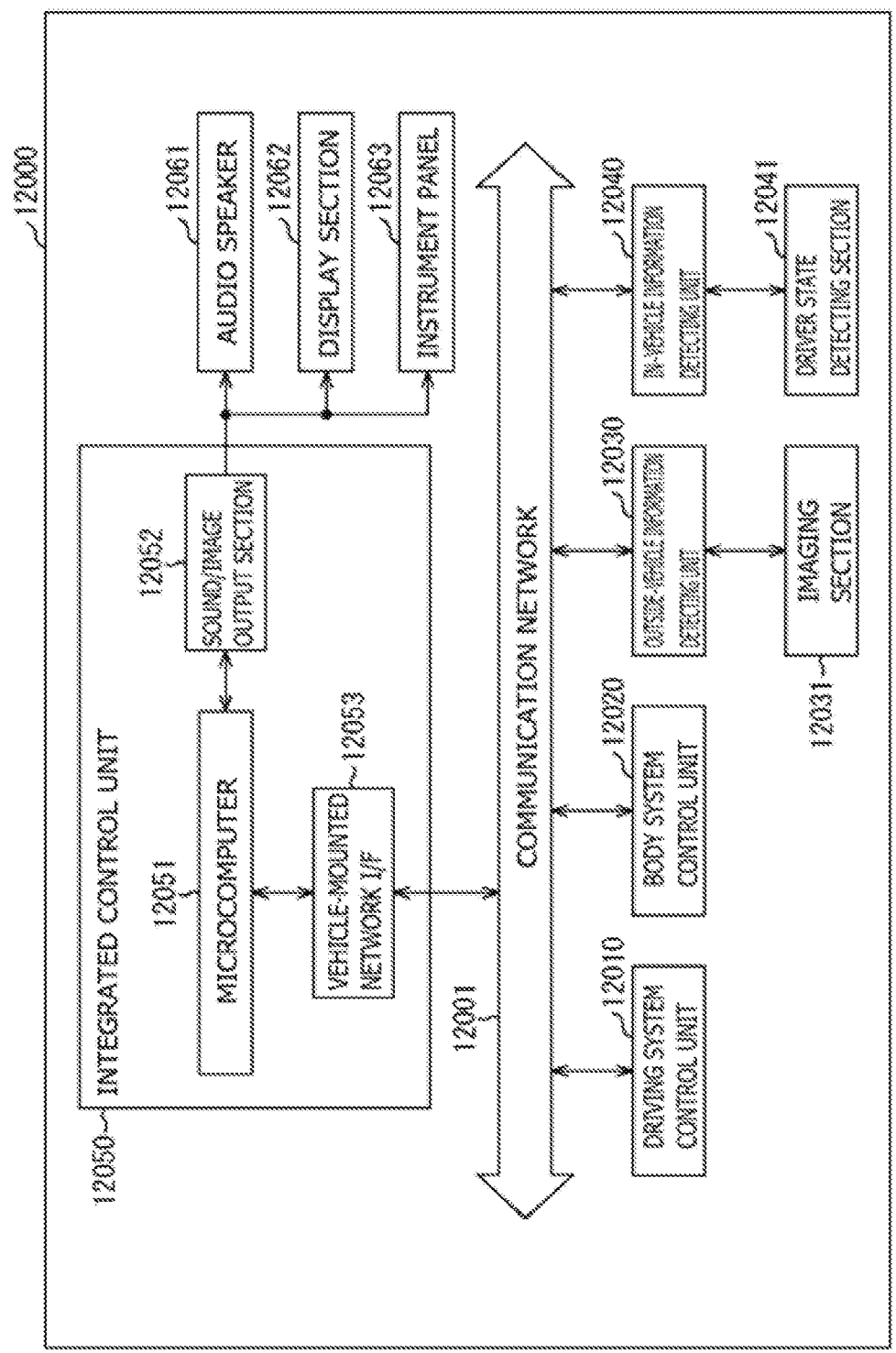
[FIG. 25]

[FIG. 26]
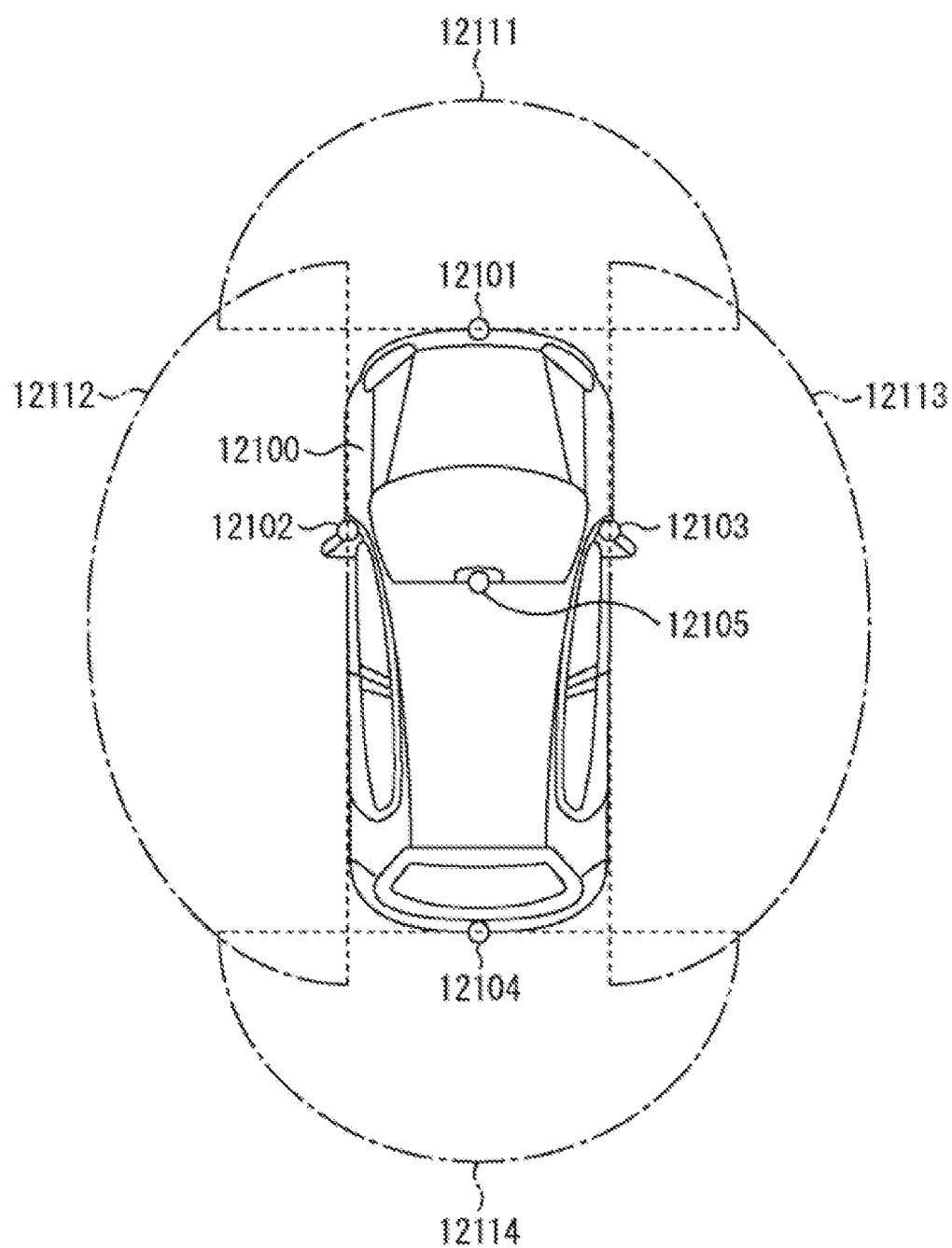

IMAGING DEVICE AND METHOD OF DRIVING IMAGING DEVICE

CROSS REFERENCE TO RELATED APPLICATIONS

This application is a U.S. National Phase of International Patent Application No. PCT/JP2021/024031 filed on Jun. 24, 2021, which claims priority benefit of Japanese Patent Application No. JP 2020-126719 filed in the Japan Patent Office on Jul. 27, 2020. Each of the above-referenced applications is hereby incorporated herein by reference in its entirety.

TECHNICAL FIELD

The present disclosure relates to an imaging device that captures an image of a subject and to a method of driving the imaging device.

BACKGROUND ART

Typically, in an imaging device, light-receiving pixels including photodiodes are disposed in a matrix, and each of the light-receiving pixels generates an electric signal corresponding to an amount of received light. PTL 1 discloses an imaging device in which multiple dummy pixels are provided to uniformize a current source load.

CITATION LIST

Patent Literature

PTL 1: Japanese Unexamined Patent Application Publication No. 2014-57367

SUMMARY OF THE INVENTION

Regarding an imaging device, high image quality of a captured image is desired and further improvement in image quality is expected.

It is desirable to provide an imaging device and a method of driving an imaging device that each allow for improvement in image quality.

An imaging device according to an embodiment of the present disclosure includes a light-receiving pixel, a power supply, a driver, and a current circuit. The light-receiving pixel includes a light-receiving element and a pixel transistor. The light-receiving element generates electric charge corresponding to an amount of received light. The power supply is configured to generate a first power supply voltage at a first power supply node. The driver is configured to drive the pixel transistor on the basis of the first power supply voltage at the first power supply node. The current circuit is configured to cause a power supply current to flow through a current path led to the first power supply node. The power supply current has a predetermined current value. The current circuit includes a load, a load driving section, and a switch. The load driving section drives the load. The switch is provided on the current path. The switch allows the power supply current to flow through the current path by being turned on in a period in which a voltage in the load changes by a predetermined voltage.

A method of driving an imaging device according to an embodiment of the present disclosure includes: generating a first power supply voltage at a first power supply node; driving a pixel transistor of a light-receiving pixel on the basis of the first power supply voltage at the first power supply node, the light-receiving pixel including a light-receiving element and the pixel transistor, the light-receiving element generating electric charge corresponding to an amount of received light; driving a load; and causing a power supply current to flow through a current path by turning on a switch provided on the current path in a period in which a voltage in the load changes by a predetermined voltage, the power supply current having a predetermined current value, the current path being led to the first power supply node.

In the imaging device and the imaging method of an imaging device each according to the embodiment of the present disclosure, the first power supply voltage at the first power supply node is generated, and the pixel transistor of the light-receiving pixel is driven on the basis of this first power supply voltage. The switch is provided on the current path led to the first power supply node. This switch is set to be on in the period in which the voltage in the driven load changes by the predetermined voltage. The power supply current having the predetermined current value flows through the current path by this switch being turned on.

BRIEF DESCRIPTION OF DRAWING

FIG. 1 is a block diagram illustrating a configuration example of an imaging device according to a first embodiment of the present disclosure.

FIG. 2 is a circuit diagram illustrating a configuration example of a light-receiving pixel illustrated in FIG. 1.

FIG. 3 is a circuit diagram illustrating a configuration example of a dummy pixel illustrated in FIG. 1.

FIG. 4 is a block diagram illustrating a configuration example of a power supply and a driving unit illustrated in FIG. 1.

FIG. 5 is a circuit diagram illustrating a configuration example of a current circuit illustrated in FIG. 4.

FIG. 6 is a block diagram illustrating a configuration example of a readout unit illustrated in FIG. 1.

FIG. 7 is a timing waveform diagram illustrating an operation example of the imaging device illustrated in FIG. 1.

FIG. 8 is another timing waveform diagram illustrating an operation example of the imaging device illustrated in FIG. 1.

FIG. 9 is a waveform diagram illustrating an example of a compensation current generated by the current circuit illustrated in FIG. 5.

FIG. 10 is a waveform diagram illustrating an operation example of the current circuit illustrated in FIG. 5.

FIG. 11 is another timing waveform diagram illustrating an operation example of the imaging device illustrated in FIG. 1.

FIG. 12 is a block diagram illustrating a configuration example of a driving unit according to a second embodiment.

FIG. 13 is a circuit diagram illustrating a configuration example of a current circuit illustrated in FIG. 12.

FIG. 14 is a timing waveform diagram illustrating an operation example of an imaging device illustrated in FIG. 12.

FIG. 15 is a waveform diagram illustrating an operation example of the imaging device illustrated in FIG. 12.

FIG. 16 is an explanatory diagram for describing parasitic capacitance in the light-receiving pixel illustrated in FIG. 2.

FIG. 17 is a timing waveform diagram illustrating another operation example of the imaging device illustrated in FIG. 12.

FIG. 18 is a waveform diagram illustrating another operation example of the imaging device illustrated in FIG. 12.

FIG. 19 is another explanatory diagram for describing the parasitic capacitance in the light-receiving pixel illustrated in FIG. 2.

FIG. 20 is a block diagram illustrating a configuration example of a power supply and a driving unit according to a modification.

FIG. 21 is a circuit diagram illustrating a configuration example of a current circuit illustrated in FIG. 20.

FIG. 22 is a block diagram illustrating a configuration example of a power supply and a driving unit according to another modification.

FIG. 23 is a circuit diagram illustrating a configuration example of a current circuit illustrated in FIG. 22.

FIG. 24 is an explanatory diagram illustrating a usage example of the imaging device.

FIG. 25 is a block diagram depicting an example of schematic configuration of a vehicle control system.

FIG. 26 is a diagram of assistance in explaining an example of installation positions of an outside-vehicle information detecting section and an imaging section.

MODES FOR CARRYING OUT THE INVENTION

In the following, a description is given of embodiments of the present disclosure in detail with reference to the drawings. It is to be noted that the description is given in the following order.
1. First Embodiment
2. Second Embodiment
3. Usage Example of Imaging Device
4. Example of Application to Mobile Body

1. First Embodiment

Configuration Example

FIG. 1 illustrates a configuration example of an imaging device (an imaging device 1) according to an embodiment. It is to be noted that a method of controlling the imaging device according to an embodiment of the present disclosure is implemented by the present embodiment and is therefore described together. The imaging device 1 includes a pixel array 11, a driving unit 12, a power supply 13, a readout unit 20, an imaging controller 14, and a signal processor 16.

The pixel array 11 includes a plurality of pixels P disposed in a matrix. The plurality of pixels P includes a plurality of light-receiving pixels P1 and a plurality of dummy pixels P2. The pixel array 11 is sectioned into a light-receiving pixel region R1 and a dummy pixel region R2. The plurality of light-receiving pixels P1 is provided in the light-receiving pixel region R1. The plurality of dummy pixels P2 is provided in the dummy pixel region R2. It is to be noted that the light-receiving pixels P1 and the dummy pixels P2 are provided separately in this example, but this is non-limiting. Alternatively, for example, some of the plurality of pixels P may be able to be used as the light-receiving pixels P1 or the dummy pixels P2.

FIG. 2 illustrates a configuration example of the light-receiving pixel P1. The pixel array 11 includes a plurality of control lines TRGL, a plurality of control lines RSTL, a plurality of control lines SELL, and a plurality of signal lines VSL. The control line TRGL extends in a horizontal direction (a lateral direction in FIG. 2). One end of the control line TRGL is coupled to the driving unit 12. This control line TRGL receives a control signal STRG from the driving unit 12. The control line RSTL extends in the horizontal direction. One end of the control line RSTL is coupled to the driving unit 12. This control line RSTL receives a control signal SRST from the driving unit 12. The control line SELL extends in the horizontal direction. One end of the control line SELL is coupled to the driving unit 12. This control line SELL receives a control signal SSEL from the driving unit 12. The signal line VSL extends in a vertical direction (a longitudinal direction in FIG. 2). One end of the signal line VSL is coupled to the readout unit 20. This signal line VSL transmits a signal SIG generated by the light-receiving pixel P to the readout unit 20. A plurality of light-receiving pixels P1 for one row is included in a pixel line L. The plurality of light-receiving pixels P1 for one row is provided side by side in the horizontal direction (a lateral direction in FIGS. 1 and 2).

The light-receiving pixel P1 is configured to generate a pixel voltage Vpix corresponding to an amount of received light. The light-receiving pixel P1 includes a photodiode PD, a transistor TRG, a floating diffusion FD, and transistors RST, AMP, and SEL. The transistors TRG, RST, AMP, and SEL are N-type MOS (Metal Oxide Semiconductor) transistors in this example.

The photodiode PD is a photoelectric conversion element that generates the amount of electric charge corresponding to the amount of received light and accumulates the generated electric charge inside. The anode of the photodiode PD is grounded and the cathode thereof is coupled to the source of the transistor TRG.

The gate of the transistor TRG is coupled to the control line TRGL, the source thereof is coupled to the cathode of the photodiode PD, and the drain thereof is coupled to the floating diffusion FD.

The floating diffusion FD is configured to accumulate the electric charge transferred from the photodiode PD via the transistor TRG. The floating diffusion FD includes, for example, a diffusion layer formed on a surface of a semiconductor substrate. FIG. 2 illustrates the floating diffusion FD by using the symbol of a capacitor.

The gate of the transistor RST is coupled to the control line RSTL, the drain thereof is supplied with a power supply voltage VDDHPX, and the source thereof is coupled to the floating diffusion FD.

The gate of the transistor AMP is coupled to the floating diffusion FD, the drain thereof is supplied with the power supply voltage VDDHPX, and the source thereof is coupled to the drain of the transistor SEL.

The gate of the transistor SEL is coupled to the control line SELL, the drain thereof is coupled to the source of the transistor AMP, and the source thereof is coupled to the signal line VSL.

With this configuration, in the light-receiving pixel P1, the electric charge accumulated in the photodiode PD is discharged, for example, by the transistors TRG and RST being turned on on the basis of the control signals STRG and SRST. Further, an accumulation period is started by these transistors TRG and RST being turned off, and the amount of electric charge corresponding to the amount of received light is accumulated in the photodiode PD. Further, after the accumulation period ends, the light-receiving pixel P1 outputs the signal SIG including a reset voltage Vreset and the pixel voltage Vpix to the signal line VSL. Specifically, first, the light-receiving pixel P1 is electrically coupled to the signal line VSL by the transistor SEL being turned on on the basis of the control signal SSEL. This couples the transistor AMP to a constant current source 21 (which will be described later) of the readout unit 20 and the transistor AMP operates as a so-called source follower. Further, in a P-phase (Pre-charge phase) period TP after the voltage of the floating diffusion FD is reset by the transistor RST being turned on, the light-receiving pixel P1 outputs, as the reset voltage Vreset, a voltage corresponding to the voltage of the floating diffusion FD at that time, as will be described below. In addition, in a D-phase (Data phase) period TD after the electric charge is transferred from the photodiode PD to the floating diffusion FD by the transistor TRG being turned on, the light-receiving pixel P1 outputs, as the pixel voltage Vpix, a voltage corresponding to the voltage of the floating diffusion FD at that time. A difference voltage between the pixel voltage Vpix and the reset voltage Vreset corresponds to the amount of light received by the light-receiving pixel P in the accumulation period. In such a manner, the light-receiving pixel P1 outputs the signal SIG including the reset voltage Vreset and the pixel voltage Vpix to the signal line VSL.

FIG. 3 illustrates a configuration example of the dummy pixel P2. The pixel array 11 includes a plurality of control lines TRGDL, a plurality of control lines RSTDL, and a plurality of control lines SELDL. As with the control line TRGL (FIG. 2), the control line TRGDL extends in the horizontal direction (a lateral direction in FIG. 3). One end of the control line TRGDL is coupled to the driving unit 12. This control line TRGDL receives a control signal STRGD from the driving unit 12. As with the control line RSTL (FIG. 2), the control line RSTDL extends in the horizontal direction. One end of the control line RSTDL is coupled to the driving unit 12. This control line RSTDL receives, from the driving unit 12, a voltage to turn on the transistor RST. As with the control line SELL (FIG. 2), the control line SELDL extends in the horizontal direction. One end of the control line SELDL is coupled to the driving unit 12. This control line SELDL receives, from the driving unit 12, a voltage to turn off the transistor SEL.

The dummy pixel P2 has the same circuit configuration as the light-receiving pixel P1, and includes a photodiode PD, a transistor TRG, a floating diffusion FD, and transistors RST, AMP, and SEL. The gate of the transistor TRG is coupled to the control line TRGDL. The gate of the transistor RST is coupled to the control line RSTDL. The gate of the transistor SEL is coupled to the control line SELDL. It is to be noted that one line of dummy pixels P2 are provided in the dummy pixel region R2 in this example as illustrated in FIG. 1; however, this is non-limiting, and a plurality of lines of dummy pixels P2 may be provided.

The driving unit 12 (FIG. 1) is configured to sequentially drive the plurality of light-receiving pixels P1 in the pixel array 11 in units of the pixel lines L on the basis of an instruction from the imaging controller 14. Specifically, the driving unit 12 drives the plurality of light-receiving pixels P1 in the pixel array 11 in units of the pixel lines L by supplying the plurality of respective control signals STRG to the plurality of control lines TRGL, supplying the plurality of respective control signals SRST to the plurality of control lines RSTL, and supplying the plurality of respective control signals SSEL to the plurality of control lines SELL in the pixel array 11. The driving unit 12 receives power supply voltages VPI and VRL from the power supply 13. The driving unit 12 is configured to drive the light-receiving pixel P1 with use of these power supply voltages VPI and VRL. In addition, as will be described later, the driving unit 12 is configured to also perform an operation of uniformizing a load current of the power supply 13 by driving the dummy pixels P2.

The power supply 13 is configured to generate the power supply voltages VPI and VRL on the basis of an instruction from the imaging controller 14. The power supply voltage VPI is a voltage used as a high-level voltage of various control signals. The power supply voltage VRL is a voltage used as a low-level voltage of various control signals.

FIG. 4 illustrates a configuration example of the power supply 13 and the driving unit 12. The imaging device 1 includes power supply terminals T1 and T2. The imaging device 1 receives a power supply voltage at the power supply terminal T1 via power supply wiring lines 101 and 102 and at the power supply terminal T2 via power supply wiring lines 101 and 103. The power supply voltage is generated by a regulator 100. The power supply voltage supplied from the regulator 100 is supplied, as a power supply voltage VDDHCP, to the power supply 13 via the power supply terminal T1. The power supply voltage supplied from the regulator 100 is supplied, as the power supply voltage VDDHPX, to the pixel array 11 via the power supply terminal T2.

The power supply 13 includes charge pumps 13A and 13B.

The charge pump 13A is configured to generate the power supply voltage VPI on the basis of an instruction from the imaging controller 14. Specifically, the charge pump 13A operates on the basis of the power supply voltage VDDHCP, and performs a generation operation in an operation period TA. The generation operation is an operation of generating the power supply voltage VPI by charging electric charge to a capacitor C11 coupled to a terminal T11. In addition, the charge pump 13A performs a holding operation in a period (an operation period TB) other than the operation period TA. The holding operation is an operation of holding the power supply voltage VPI in this capacitor C11. The charge pump 13A generates the power supply voltage VPI by repeating these operations. Further, the charge pump 13A is configured to supply the thus-generated power supply voltage VPI to the driving unit 12 via a power supply node NVPI.

Similarly, the charge pump 13B is configured to generate the power supply voltage VRL on the basis of an instruction from the imaging controller 14. Specifically, the charge pump 13B operates on the basis of the power supply voltage VDDHCP, and performs a generation operation in the operation period TA. The generation operation is an operation of generating the power supply voltage VRL by charging electric charge to a capacitor C21 coupled to a terminal T21. In addition, the charge pump 13B performs a holding operation in the operation period TB. The holding operation is an operation of holding the power supply voltage VRL in this capacitor C21. The charge pump 13B is configured to generate the power supply voltage VRL by repeating these operations. Further, the charge pump 13B is configured to supply the thus-generated power supply voltage VRL to the driving unit 12 via a power supply node NVRL.

The driving unit 12 includes a plurality of drivers DRVT, a plurality of drivers DRVR, a plurality of drivers DRVS, a current circuit 40, and a control signal generator 49. FIG. 4 illustrates drivers $DRVT_n$, $DRVR_n$, and $DRVS_n$ associated with the n-th pixel line L in the light-receiving pixel region R1. In addition, FIG. 4 also illustrates parasitic capacitance Cp of each of the various control lines in the pixel array 11. This parasitic capacitance Cp includes capacitance of the pixel P coupled to the control line.

The plurality of drivers DRVT is provided in association with the plurality of respective control lines TRGL in the light-receiving pixel region R1. Each of the plurality of drivers DRVT is configured to drive the control line TRGL associated with that driver DRVT with use of the control signal STR on the basis of a control signal supplied from the control signal generator 49, to thereby drive a plurality of light-receiving pixels P1 coupled to that control line TRGL. Specifically, the driver $DRVT_n$ is configured to drive a control line $TRGL_n$ related to the n-th pixel line L in the light-receiving pixel region R1 with use of a control signal STRG, on the basis of the control signal supplied from the control signal generator 49, to thereby drive a plurality of light-receiving pixels P1 related to the n-th pixel line L. The driver DRVT is coupled to the power supply nodes NVPI and NVRL, and operates on the basis of the power supply voltages VPI and VRL. The control signal STRG transitions between the power supply voltage VPI and the power supply voltage VRL.

The plurality of drivers DRVR is provided in association with the plurality of respective control lines RSTL in the light-receiving pixel region R1. Each of the plurality of drivers DRVR is configured to drive the control line RSTL associated with that driver DRVR with use of the control signal SRST on the basis of a control signal supplied from the control signal generator 49, to thereby drive a plurality of light-receiving pixels P1 coupled to that control line RSTL. Specifically, the driver $DRVR_n$ is configured to drive a control line $RSTL_n$ related to the n-th pixel line L in the light-receiving pixel region R1 with use of a control signal SRST, on the basis of the control signal supplied from the control signal generator 49, to thereby drive the plurality of light-receiving pixels P1 related to the n-th pixel line L. The driver DRVR is coupled to the power supply node NVPI and a ground node, and operates on the basis of the power supply voltage VPI and a ground voltage. The control signal SRST transitions between the power supply voltage VPI and the ground voltage.

The plurality of drivers DRVS is provided in association with the plurality of respective control lines SELL in the light-receiving pixel region R1. Each of the plurality of drivers DRVS is configured to drive the control line SELL associated with that driver DRVS with use of the control signal SSEL on the basis of a control signal supplied from the control signal generator 49, to thereby drive a plurality of light-receiving pixels P1 coupled to that control line SELL. Specifically, the driver $DRVS_n$ is configured to drive a control line $SELL_n$ related to the n-th pixel line L in the light-receiving pixel region R1 with use of a control signal $SSEL_n$ on the basis of the control signal supplied from the control signal generator 49, to thereby drive the plurality of light-receiving pixels P1 related to the n-th pixel line L. The driver DRVS is coupled to the power supply nodes NVPI and NVRL, and operates on the basis of the power supply voltages VPI and VRL. The control signal SSEL transitions between the power supply voltage VPI and the power supply voltage VRL.

In addition, the driving unit 12 is configured to supply the power supply voltage VPI to the control line RSTDL in the dummy pixel region R2 and to supply the power supply voltage VRL to the control line SELDL in the dummy pixel region R2. Thus, in the dummy pixel P2, the transistor RST is maintained to be on and the transistor SEL is maintained to be off. It is to be noted that, in this example, the power supply voltage VPI is supplied directly to the control line RSTDL and the power supply voltage VRL is supplied directly to the control line SELDL; however, this is non-limiting, and the power supply voltages VPI and VRL may each be supplied via a driver.

The current circuit 40 is configured to cause a compensation current IB to flow from the power supply node NVPI toward the power supply node NVRL by driving the plurality of dummy pixels P2 with use of the control signal STRGD on the basis of control signals DON and NSH supplied from the control signal generator 49. The compensation current IB is a current for uniformizing the load current of the power supply 13.

FIG. 5 illustrates a configuration example of the current circuit 40. The current circuit 40 includes a load driving section 41, a comparison circuit 42, and a current output section 43.

The load driving section 41 is configured to drive the plurality of dummy pixels P2 by driving the control line TRGDL in the dummy pixel region R2. The load driving section 41 includes a constant current source CS, transistors MN11, MN12, MP13, and MP14, a load driver DRV15, and a switch SW16. The transistors MN11 and MN12 are N-type MOS transistors. The transistors MP13 and MP14 are P-type MOS transistors.

The constant current source CS is configured to cause a current of a predetermined current value to flow through the transistor MN11. The gate of the transistor MN11 is coupled to the drain of the transistor MN11 and the constant current source CS and is also coupled to the respective gates of the transistors MN12 and MN21. The drain of the transistor MN11 is coupled to the gate of the transistor MN11 and the constant current source CS and is also coupled to the respective gates of the transistors MN12 and MN21. The source of the transistor MN11 is grounded. The gate of the transistor MN12 is coupled to the gate and the drain of the transistor MN11 and is also coupled to the constant current source CS and the gate of the transistor MN21. The drain of the transistor MN12 is coupled to the gate and the drain of the transistor MP13 and is also coupled to the gate of the transistor MP14. The source of the transistor MN12 is grounded. The transistors MN11 and MN12 form a current mirror circuit. The gate of the transistor MP13 is coupled to the respective drains of the transistors MN12 and MP13 and is also coupled to the gate of the transistor MP14. The source of the transistor MP13 receives the power supply voltage VDD. The drain of the transistor MP13 is coupled to the gate of the transistor MP13 and the drain of the transistor MN12 and is also coupled to the gate of the transistor MP14. The gate of the transistor MP14 is coupled to the gate and the drain of the transistor MP13 and is also coupled to the drain of the transistor MN12. The source of the transistor MP14 receives the power supply voltage VDD. The drain of the transistor MP14 is coupled to the switch SW16. The transistors MP13 and MP14 form a current mirror circuit. The load driver DRV15 is configured to drive the control line TRGDL in the dummy pixel region R2 with use of the control signal STRGD on the basis of the control signal DON. The load driver DRV15 operates on the basis of a current supplied via the switch SW16 and the ground voltage. The switch SW16 includes, for example, one or more MOS transistors and is configured to be turned on and off on the basis of the control signal DON. One end of the switch SW16 is coupled to the drain of the transistor MP14, and another end there of is coupled to the load driver DRV15. With this configuration, in the load driving section 41, in a case where the voltage of the control signal DON is at the low level, the switch SW16 is turned off. Accordingly, a current path A including the transistor MP14 and the switch SW16 is cut off and the load driver DRV15 sets the voltage of the control signal STRGD to the ground voltage. In addition, in a case where the voltage of the control signal DON is at the high level, the switch SW16 is turned on. Accordingly, the current path A becomes effective and the load driver DRV15 receives the current having the predetermined current value. The load driver DRV15 is configured to drive the control line TRGDL by this current and increase the voltage of the control signal STRGD in the control line TRGDL linearly from the ground voltage.

The comparison circuit 42 is configured to generate a signal CMP by comparing a voltage Vref with the voltage of the control signal STRGD. Specifically, the comparison circuit 42 is configured to change the voltage of the signal CMP to the high level in a case where the voltage of the control signal STRGD is lower than the voltage Vref, and change the voltage of the signal CMP to the low level in a case where the voltage of the control signal STRGD is higher than the voltage Vref.

The current output section 43 is configured to cause, on the basis of the control signal DON and the signal CMP, the compensation current IB from the power supply node NVPI supplied with the power supply voltage VPI toward the power supply node NVPI supplied with the power supply voltage VRL. The current output section 43 includes the transistor MN21, a transistor MP22, a plurality of transistors MP23, an AND (AND) circuit L24, and a switch SW25. The transistor MN21 is an N-type MOS transistor. The transistor MP22 and the plurality of transistors MP23 are P-type MOS transistors.

The gate of the transistor MN21 is coupled to the gate and the drain of the transistor MN11 and is also coupled to the constant current source CS and the gate of the transistor MN12. The drain of the transistor MN21 is coupled to the gate and the drain of the transistor MP22. The source of the transistor MN21 is grounded. The gate of the transistor MP22 is coupled to the respective drains of the transistors MN21 and MP22. The source of the transistor MP22 is coupled to the power supply node NVPI. The drain of the transistor MP22 is coupled to the gate of the transistor MP22 and the drain of the transistor MN21. The plurality of transistors MP23 is configured to be individually set to be on or off on the basis of the control signal NSH supplied from the control signal generator 49. The gate of each of one or more transistors MP23 set to be on is coupled to the gate and the drain of the transistor MP22 and is also coupled to the drain of the transistor MN21. The source of each of the one or more transistors MP23 set to be on is coupled to the power supply node NVPI. The drain of each of the one or more transistors MP23 set to be on is coupled to the switch SW25. The AND circuit L24 is configured to generate a signal ION by performing an AND calculation on the basis of the control signal DON and an output signal of the comparison circuit 42. The switch SW25 includes, for example, one or more MOS transistors and is configured to be turned on and off on the basis of the signal ION. One end of the switch SW25 is coupled to the drain of each of the one or more transistors MP23 set to be on among the plurality of transistors MP23. Another end of the switch SW25 is coupled to the power supply node NVRL. With this configuration, in the current output section 43, in a case where the voltage of the signal ION is at the low level, the switch SW25 is turned off, which cuts off a current path B from the power supply node NVPI toward the power supply node NVRL. In addition, in a case where the voltage of the signal ION is at the high level, the switch SW25 is turned on, which allows the current path B from the power supply node NVPI toward the power supply node NVRL to be effective. This allows the compensation current IB corresponding to the number of the transistors MP23 set to be on by the control signal NSH to flow through the current path B. In such a manner, in the imaging device 1, the load current of the power supply 13 is uniformized as will be described later by allowing the compensation current IB to flow through the current path B from the power supply node NVPI toward the power supply node NVRL.

The control signal generator 49 (FIG. 4) is configured to control operations of the plurality of drivers DRVT, the plurality of drivers DRVR, and the plurality of drivers DRVS on the basis of an instruction from the imaging controller 14. In addition, the control signal generator 49 also has a function of generating the control signal NSH on the basis of the number of the pixel lines L to be driven and controlling the operation of the current circuit 40 with use of the control signals DON and NSH, as will be described later.

The readout unit 20 (FIG. 1) is configured to generate image data DT0 on the basis of an instruction from the imaging controller 14 by performing AD conversion on the basis of the signal SIG supplied from the pixel array 11 via the signal line VSL.

FIG. 6 illustrates a configuration example of the readout unit 20. It is to be noted that FIG. 6 also illustrates the imaging controller 14 and the signal processor 16 in addition to the readout unit 20. The readout unit 20 includes a plurality of constant current sources 21, a plurality of AD (Analog to Digital) converters ADC, and a plurality of switch sections 27. The plurality of constant current sources 21 is provided in association with the plurality of respective signal lines VSL. Similarly, the plurality of AD converters ADC and the plurality of switch sections 27 are also provided in association with the plurality of respective signal lines VSL. The following describes the constant current source 21, the AD converter ADC, and the switch section 27 associated with one certain signal line VSL.

The constant current source 21 is configured to cause a predetermined current to flow through the signal line VSL associated therewith. One end of the constant current source 21 is coupled to the associated signal line VSL and another end thereof is grounded.

The AD converter ADC is configured to perform AD conversion on the basis of the signal SIG in the signal line VSL associated therewith. The AD converter ADC includes capacitors 22 and 23, a comparison circuit 24, a counter 25, and a latch 26.

One end of the capacitor 22 is coupled to the signal line VSL and supplied with the signal SIG. Another end of the capacitor 22 is coupled to a first input terminal of the comparison circuit 24. One end of the capacitor 23 is supplied with the reference signal REF supplied from a reference signal generation section 15 (which will be described later) of the imaging controller 14 and another end thereof is coupled to a second input terminal of the comparison circuit 24.

The comparison circuit 24 is configured to generate a signal CP by performing a comparison operation on the basis of the signal SIG supplied from the light-receiving pixel P1 via the signal line VSL and the capacitor 22, and the reference signal REF supplied from the reference signal generation section 15 (which will be described later) of the imaging controller 14 via the capacitor 23. As will be described later, the reference signal REF has a so-called ramp waveform in which a voltage level gradually changes over time in two periods (a P-phase period TP and a D-phase period TD) in which the AD converter ADC performs the AD conversion. The comparison circuit 24 sets an operating point by setting the voltages of the capacitors 22 and 23 on the basis of a control signal AZ supplied from the imaging controller 14. Further, thereafter, the comparison circuit 24 performs a comparison operation of comparing the reset voltage Vreset included in the signal SIG and the voltage of the reference signal REF in the P-phase period TP and performs a comparison operation of comparing the pixel voltage Vpix included in the signal SIG and the voltage of the reference signal REF in the D-phase period TD.

The counter 25 is configured to perform a count operation of counting the pulses of a clock signal CLK supplied from the imaging controller 14 on the basis of the signal CP supplied from the comparison circuit 24. Specifically, in the P-phase period TP, the counter 25 generates a count value CNTP by counting the pulses of the clock signal CLK until the transition of the signal CP, and outputs this count value CNTP as a digital code having a plurality of bits. In addition, in the D-phase period TD, the counter 25 generates a count value CNTD by counting the pulses of the clock signal CLK until the transition of the signal CP, and outputs this count value CNTD as a digital code having a plurality of bits.

The latch 26 is configured to temporarily hold the digital code supplied from the counter 25.

The switch section 27 is configured to supply the digital code held by the latch 26 to a bus BUS by being turned on on the basis of the control signal CTL supplied from the imaging controller 14. The bus BUS has a plurality of wiring lines, and is configured to transfer a digital code having a plurality of bits. The plurality of switch sections 27 is sequentially turned on on the basis of the control signal CTL. Accordingly, the readout unit 20 sequentially supplies, as the image data DT0, the plurality of digital codes generated by the plurality of AD converters ADC to the signal processor 16 via the bus BUS.

The imaging controller 14 (FIG. 1) is configured to control an operation of the imaging device 1 by supplying respective control signals to the driving unit 12, the power supply 13, the readout unit 20, and the signal processor 16 and controlling the respective operations of these circuits. Specifically, the imaging controller 14 supplies the control signal to the power supply 13 and thereby performs a control to cause the charge pump 13A to generate the power supply voltage VPI and cause the charge pump 13B to generate the power supply voltage VRL. In addition, the imaging controller 14 supplies the control signal to the driving unit 12 and thereby performs a control to cause the driving unit 12 to sequentially drive the plurality of light-receiving pixels P1 in the pixel array 11 and to drive the plurality of dummy pixels P2 in units of the pixel lines L. In addition, the imaging controller 14 supplies the control signal to the readout unit 20 and thereby performs a control to cause the readout unit 20 to generate the image data DT0 by performing the AD conversion on the basis of the signal SIG. In addition, the imaging controller 14 supplies the control signal to the signal processor 16 and thereby controls the operation of signal processor 16.

The imaging controller 14 includes the reference signal generation section 15. The reference signal generation section 15 is configured to generate the reference signal REF. The reference signal REF has a so-called ramp waveform in which a voltage level gradually changes over time in two periods (the P-phase period TP and the D-phase period TD) in which the AD converter ADC performs the AD conversion. The reference signal generation section 15 supplies this reference signal REF to the AD converter ADC of the readout unit 20.

The signal processor 16 is configured to generate image data DT by performing predetermined image processing on the basis of the image data DT0 and an instruction from the imaging controller 14. The predetermined image processing includes, for example, a CDS (CDS; Correlated Double Sampling) process. In the CDS process, the signal processor 16 generates a pixel value VAL by using the principle of correlated double sampling on the basis of the count value CNTP obtained in the P-phase period TP and the count value CNTD obtained in the D-phase period TD. The count value CNTP and the count value CNTD are included in the image data DT0.

Here, the light-receiving pixel P1 corresponds to a specific example of a "light-receiving pixel" in the present disclosure. The photodiode PD corresponds to a specific example of a "light-receiving element" in the present disclosure. The floating diffusion FD corresponds to a specific example of an "accumulation element" in the present disclosure. The transistor TRG corresponds to a specific example of a "pixel transistor" and a "transfer transistor" in the present disclosure. The transistor RST corresponds to a specific example of a "reset transistor" in the present disclosure. The transistor SEL corresponds to a specific example of an "output transistor" in the present disclosure. The power supply 13 corresponds to a specific example of a "power supply" in the present disclosure. The operation period TA corresponds to a specific example of a "first operation period" in the present disclosure. The operation period TB corresponds to a specific example of a "second operation period" in the present disclosure. The power supply nodes NVPI and NVRL correspond to specific examples of a "first power supply node" and a "second power supply node" in the present disclosure. The driver DRVT corresponds to a specific example of a "driver" in the present disclosure. The current circuit 40 corresponds to a specific example of a "current circuit" in the present disclosure. The current path B corresponds to a specific example of a "current path" in the present disclosure. The plurality of dummy pixels P2 corresponds to a specific example of a "load" in the present disclosure. The transistor TRG of the dummy pixel P2 corresponds to a specific example of a "load transistor" in the present disclosure. The load driving section 41 corresponds to a specific example of a "load driving section" in the present disclosure. The switch SW25 corresponds to a specific example of a "switch" in the present disclosure. The constant current source CS corresponds to a specific example of a "constant current source" in the present disclosure. The control signal generator 49 corresponds to a specific example of a "first current controller" in the present disclosure.

Operations and Workings

Next, the operations and workings of the imaging device 1 according to the present embodiment are described.

Overview of Overall Operation

First, an overview of the overall operation of the imaging device 1 is described with reference to FIGS. 1 and 3. The driving unit 12 sequentially drives the plurality of light-receiving pixels P1 in the pixel array 11 in units of the pixel lines L on the basis of an instruction from the imaging controller 14. The light-receiving pixel P1 outputs the reset voltage Vreset as the signal SIG in the P-phase period TP and outputs the pixel voltage Vpix corresponding to the amount of received light as the signal SIG in the D-phase period TD.

In addition, the current circuit 40 of the driving unit 12 causes the compensation current IB to flow through the current path B from the power supply node NVPI toward the power supply node NVRL by driving the dummy pixel P2.

The reference signal generation section 15 generates the reference signal REF. The readout unit 20 generates the image data DT0 on the basis of the signal SIG supplied from the pixel array 11 via the signal line VSL and an instruction from the imaging controller 14. Specifically, in the readout unit 20, the AD converter ADC generates the count value CNTP on the basis of the signal SIG by performing the AD conversion in the P-phase period TP and outputs this count value CNTP as a digital code having a plurality of bits. In addition, the AD converter ADC generates the count value CNTD on the basis of the signal SIG by performing the AD conversion in the D-phase period TD and outputs this count value CNTD as a digital code having a plurality of bits. The readout unit 20 sequentially supplies, as the image data DT0, the plurality of digital codes including the count values CNTP generated by the plurality of AD converters ADC and the plurality of digital codes including the count values CNTD generated by the plurality of AD converters ADC to the signal processor 16 via the bus BUS. The signal processor 16 generates the image data DT by performing predetermined image processing on the basis of the image data DT0 and an instruction from the imaging controller 14.

Detailed Operation

Next, a description is given of a detailed operation of the imaging device 1. In each of the plurality of light-receiving pixels P1 (FIG. 2) in the pixel array 11, electric charge accumulated in the photodiode PD is discharged by the transistors TRG and RST being turned on on the basis of the control signals STRG and SRST. Further, an accumulation period is started by these transistors TRG and RST being turned off, and the amount of electric charge corresponding to the amount of received light is accumulated in the photodiode PD. Further, after the accumulation period ends, the readout unit 20 performs AD conversion on the basis of the signal SIG including the reset voltage Vreset and the pixel voltage Vpix outputted by the light-receiving pixel P1. The following describes in detail about the AD conversion related to a particular light-receiving pixel P1 of interest.

FIG. 7 illustrates an operation example of the AD conversion in the imaging device 1. (A) illustrates the waveform of the control signal SSEL. (B) illustrates the waveform of the control signal SRST. (C) illustrates the waveform of the control signal STRG. (D) illustrates the waveform of the control signal AZ. (E) illustrates the waveform of the reference signal REF. (F) illustrates the waveform of the signal SIG. (G) illustrates the waveform of the clock signal CLK. (H) illustrates the waveform of the signal CP. (I) illustrates the operation of the power supply 13. (E) and (F) of FIG. 7 illustrate the waveforms of the reference signal REF and the signal SIG by using the same voltage axis. In addition, in this description, the waveform of the reference signal REF illustrated in (E) of FIG. 7 is the waveform of a voltage supplied to the second input terminal of the comparison circuit 24 via the capacitor 23. The waveform of the signal SIG illustrated in (F) of FIG. 7 is the waveform of a voltage supplied to the first input terminal of the comparison circuit 24 via the capacitor 22.

First, a horizontal period H starts at a timing t11. Accordingly, the charge pump 13A of the power supply 13 performs the generation operation of generating the power supply voltage VPI by charging electric charge to the capacitor C11 in the operation period TA starting from this timing t11, and the charge pump 13B performs the generation operation of generating the power supply voltage VRL by charging electric charge to the capacitor C21 in the operation period TA ((I) of FIG. 7). In addition, at this timing t11, the driving unit 12 changes the voltage of the control signal SSEL from the low level to the high level ((A) of FIG. 7). This turns on the transistor SEL in the light-receiving pixel P1, and the light-receiving pixel P1 is electrically coupled to the signal line VSL. In addition, the driving unit 12 changes the voltage of the control signal SRST from the low level to the high level at this timing t11 ((B) of FIG. 7). This turns on the transistor RST in the light-receiving pixel P1, and the voltage of the floating diffusion FD is set to the power supply voltage VDDHPX (a reset operation). Further, the light-receiving pixel P1 outputs a voltage corresponding to the voltage of the floating diffusion FD at this time. In addition, the imaging controller 14 changes the voltage of the control signal AZ from the low level to the high level at this timing t11 ((D) of FIG. 7). Accordingly, the comparison circuit 24 of the AD converter ADC sets an operating point by setting the voltages of the capacitors 22 and 23. In such a manner, the voltage of the signal SIG is set to the reset voltage Vreset and the voltage of the reference signal REF is set to the same voltage as the voltage (the reset voltage Vreset) of the signal SIG ((E) and (F) of FIG. 7).

Further, at a timing t12, the driving unit 12 changes the voltage of the control signal SRST from the high level to the low level ((B) of FIG. 7). This turns off the transistor RST in the light-receiving pixel P1 and the reset operation is ended.

Thereafter, at a timing t13, the charge pump 13A ends the generation operation of generating the power supply voltage VPI and performs the holding operation of holding the power supply voltage VPI in the capacitor C11. Similarly, the charge pump 13B ends the generation operation of generating the power supply voltage VRL and performs the holding operation of holding the power supply voltage VRL in the capacitor C21 ((I) of FIG. 7).

Thereafter, at a timing t14, the imaging controller 14 changes the voltage of the control signal AZ from the high level to the low level ((D) of FIG. 7). Accordingly, the comparison circuit 24 ends the setting of the operating point.

In addition, the reference signal generation section 15 changes the voltage of the reference signal REF to a voltage V1 at this timing t14 ((E) of FIG. 7). This makes the voltage of the reference signal REF higher than the voltage of the signal SIG. The comparison circuit 24 therefore changes the voltage of the signal CP from the low level to the high level ((H) of FIG. 7).

Further, in a period (the P-phase period TP) from a timing t15 to a timing t17, the AD converter ADC performs the AD conversion on the basis of the signal SIG. Specifically, first, at the timing t15, the reference signal generation section 15 starts to decrease the voltage of the reference signal REF from the voltage V1 at a predetermined change rate ((E) of FIG. 7). In addition, at this timing t15, the imaging controller 14 starts to generate the clock signal CLK ((G) of FIG. 7). The counter 25 of the AD converter ADC counts the pulses of this clock signal CLK by performing a count operation.

Further, at a timing t16, the voltage of the reference signal REF falls below the voltage (the reset voltage Vreset) of the signal SIG ((E) and (F) of FIG. 7). Accordingly, the comparison circuit 24 of the AD converter ADC changes the voltage of the signal CP from the high level to the low level ((H) of FIG. 7). The counter 25 of the AD converter ADC stops the count operation on the basis of this transition of the signal CP. The count value (the count value CNTP) of the counter 25 at this time is a value corresponding to the reset voltage Vreset. The latch 26 holds this count value CNTP. Further, the counter 25 resets the count value.

Thereafter, at the timing t17, the imaging controller 14 stops generating the clock signal CLK in accordance with the end of the P-phase period TP ((G) of FIG. 7). In addition, the reference signal generation section 15 sets the voltage of the reference signal REF to a voltage V2 at this timing t17 ((E) of FIG. 7). Further, in the period at and after this timing t17, the readout unit 20 supplies the count value CNTP held by the latch 26 to the signal processor 16 as the image data DT0.

Thereafter, at a timing t18, the imaging controller 14 sets the voltage of the reference signal REF to the voltage V1 ((E) of FIG. 7). This makes the voltage of the reference signal REF higher than the voltage (the reset voltage Vreset) of the signal SIG. The comparison circuit 24 therefore changes the voltage of the signal CP from the low level to the high level ((H) of FIG. 7).

Thereafter, at a timing t19, the driving unit 12 changes the voltage of the control signal STRG from the low level to the high level ((C) of FIG. 7). This turns on the transistor TRG in the light-receiving pixel P1, and the electric charge generated by the photodiode PD is transferred to the floating diffusion FD (an electric charge transfer operation). Further, the light-receiving pixel P1 outputs a voltage corresponding to the voltage of the floating diffusion FD at this time. In such a manner, the voltage of the signal SIG changes to the pixel voltage Vpix ((F) of FIG. 7).

Further, at a timing t20, the driving unit 12 changes the voltage of the control signal STRG from the high level to the low level ((C) of FIG. 7). This turns off the transistor TRG in the light-receiving pixel P1, and the electric charge transfer operation is ended.

Further, in a period (the D-phase period TD) from a timing t21 to a timing t23, the AD converter ADC performs the AD conversion on the basis of the signal SIG. Specifically, first, at the timing t21, the reference signal generation section 15 starts to decrease the voltage of the reference signal REF from the voltage V1 at a predetermined change rate ((E) of FIG. 7). In addition, at this timing t21, the imaging controller 14 starts to generate the clock signal CLK ((G) of FIG. 7). The counter 25 of the AD converter ADC counts the pulses of this clock signal CLK by performing a count operation.

Further, at a timing t22, the voltage of the reference signal REF falls below the voltage (the pixel voltage Vpix) of the signal SIG ((E) and (F) of FIG. 7). Accordingly, the comparison circuit 24 of the AD converter ADC changes the voltage of the signal CP from the high level to the low level ((H) of FIG. 7). The counter 25 of the AD converter ADC stops the count operation on the basis of this transition of the signal CP. The count value (the count value CNTD) of the counter 25 at this time is a value corresponding to the pixel voltage Vpix. The latch 26 holds this count value CNTD. Further, the counter 25 resets the count value.

Thereafter, at the timing t23, the imaging controller 14 stops generating the clock signal CLK in accordance with the end of the D-phase period TD ((G) of FIG. 7). In addition, the reference signal generation section 15 sets the voltage of the reference signal REF to a voltage V3 at this timing t23 ((E) of FIG. 7). Further, in the period at and after this timing t23, the readout unit 20 supplies the count value CNTD held by the latch 26 to the signal processor 16 as the image data DT0.

Thereafter, at a timing t24, the driving unit 12 changes the voltage of the control signal SSEL from the high level to the low level ((A) of FIG. 7). This turns off the transistor SEL in the light-receiving pixel P1, and the light-receiving pixel P1 is electrically decoupled from the signal line VSL.

In such a manner, the readout unit 20 supplies the image data DT0 including the count values CNTP and CNTD to the signal processor 16. The signal processor 16 generates the pixel value VAL, for example, on the basis of the count values CNTP and CNTD included in the image data DT0 by using the principle of correlated double sampling. Specifically, the signal processor 16 generates the pixel value VAL, for example, by subtracting the count value CNTP from the count value CNTD. In such a manner, the signal processor 16 generates the image data DT by performing a predetermined process.

(Regarding Operation of Current Circuit 40)

Next, a detailed description is given of the operation of the current circuit 40 of the driving unit 12. The current circuit 40 causes the compensation current IB to flow through the current path B from the power supply node NVPI toward the power supply node NVRL by driving the dummy pixel P2. The compensation current IB is a current for uniformizing the load current of the power supply 13.

FIG. 8 illustrates an operation example of the imaging device 1. (A) illustrates the waveform of the power supply current IDDHCP at the power supply terminal T1 (FIG. 4) of the imaging device 1. (B) illustrates the waveform of the power supply voltage VDDHPX at the power supply terminal T2 of the imaging device 1. (C) illustrates the waveform of the reference signal REF. (D) illustrates the waveform of the control signal $STRG_{n+1}$ related to the (n+1)-th pixel line L. (E) illustrates the waveform of the control signal $STRG_n$ related to the n-th pixel line L. (F) and (G) illustrate the waveforms of the compensation current IB that flows through the current path B of the current circuit 40. (F) of FIG. 8 illustrates the waveform of the compensation current IB1 that flows into the current path B of the current circuit 40 from the power supply node NVPI. (G) of FIG. 8 illustrates the waveform of the compensation current IB2 that flows out from the current path B of the current circuit 40 to the power supply node NVRL. The compensation currents IB1 and IB2 have positive values in a case of flowing into the current circuit 40 and have negative values in a case of flowing out from the current circuit 40. The compensation current IB1 and the compensation current IB2 have opposite polarities to each other and have the same magnitude as each other.

In the imaging device 1, the driving unit 12 performs accumulation start driving D1 and turns on the transistors TRG and RST to thereby discharge the electric charge accumulated in the photodiode PD. Thereafter, these transistors TRG and RST are turned off, and an accumulation period T is thereby started. Further, the driving unit 12 performs readout driving D2 and turns on the transistor TRG to thereby transfer the electric charge accumulated in the photodiode PD to the floating diffusion FD. The AD conversion is performed on the basis of a voltage in this floating diffusion FD.

For example, the $DRVT_n$ related to the n-th pixel line L in the driving unit 12 changes the voltage of the control signal $STRG_n$ to the high level in a period from a timing t32 to a timing t33 ((E) of FIG. 8). The accumulation period T is thereby started. Further, the driver $DRVT_n$ changes the voltage of the control signal $STRG_n$ to the high level in a period from a timing t55 to a timing t56. The accumulation period T is thereby ended. The period from the timing t32 to the timing t33 belongs to the operation period TA in which the power supply 13 performs the generation operation. In addition, the period from the timing t55 to the timing t56 belongs to the operation period TB in which the power supply 13 performs the holding operation.

Similarly, the driver $DRVT_{n+1}$ related to the (n+1)-th pixel line L in the driving unit 12 changes the voltage of the control signal $STRG_{n+1}$ to the high level in a period from a timing t42 to a timing t43 ((D) of FIG. 8). The accumulation period T is thereby started. Further, the driver $DRVT_{n+1}$ changes the voltage of the control signal $STRG_{n+1}$ to the high level in a period from a timing t65 to a timing t66. The accumulation period T is thereby ended. The period from the timing t42 to the timing t43 belongs to the operation period TA in which the power supply 13 performs the generation operation. In addition, the period from the timing t65 to the timing t66 belongs to the operation period TB in which the power supply 13 performs the holding operation.

As illustrated in FIG. 4, such a driver DRVT generates the control signal STRG on the basis of the power supply voltage VPI supplied from the power supply node NVPI and the power supply voltage VRL supplied from the power supply node NVRL. The load current of the power supply 13 is desirably the same among the plurality of operation periods TA. Therefore, in the imaging device 1, in each of the plurality of operation periods TA, the current circuit 40 causes the compensation current IB to flow through the current path B in accordance with the number of the pixel lines L to be driven ((D) to (G) of FIG. 8). Specifically, in the operation period TA from a timing t31 to a timing t34 and the operation period TA from a timing t41 to a timing t44, for example, a great number of the pixel lines L are to be driven by changing the voltage of the control signal STRG to the high level. Therefore, the imaging device 1 reduces the compensation current IB to flow through the current path B. In addition, in the operation period TA from a timing t51 to a timing t54 and the operation period TA from a timing t61 to a timing t64, for example, a small number of the pixel lines L are to be driven by changing the voltage of the control signal STRG to the high level. Therefore, the imaging device 1 increases the compensation current IB to flow through the current path B. This makes it possible to allow the total current of the current that flows through the plurality of drivers DRVT and the compensation current that flows through the current circuit 40 to be substantially the same in the plurality of operation periods TA.

Thus, in the plurality of operation periods TA, it is possible to uniformize the load current of the power supply 13, and uniformize the power supply current IDDHCP that flows through the power supply terminal T1 ((A) of FIG. 8). The power supply voltage VDDHCP at the power supply terminal T1 changes due to the power supply current IDDHCP. However, it is possible to uniformize the change in the power supply voltage VDDHCP at the power supply terminal T1 by uniformizing the power supply current IDDHCP that flows through the power supply terminal T1. As illustrated in FIG. 4, the power supply voltage VDDHCP and the power supply voltage VDDHPX are both generated by the regulator 100 and supplied via the power supply wiring line 101. However, it is possible to also uniformize the change in the power supply voltage VDDHPX at the power supply terminal T2 by uniformizing the change in the power supply voltage VDDHCP at the power supply terminal T1 ((B) of FIG. 8). In such a manner, it is possible to uniformize the change in the power supply voltage VDDHPX supplied to the pixel array 11 among the plurality of operation periods TA. Accordingly, it is possible to suppress an influence on image quality.

FIG. 9 illustrates an example of the compensation current IB. (A) illustrates the waveform of the control signal STRG generated by the driver DRVT. (B) illustrates the waveform of a current (a driver current IDRV1) that flows into the driver DRVT from the power supply node NVPI. (C) illustrates the waveform of a current (a driver current IDRV2) that flows out from the driver DRVT to the power supply node NVRL. (D) illustrates the waveform of the compensation current IB1 that flows into the current path B of the current circuit 40 from the power supply node NVPI. (E) illustrates the waveform of the compensation current IB2 that flows out from the current path B of the current circuit 40 to the power supply node NVRL.

When the driver DRVT changes the voltage of the control signal STRG from the low level to the high level, the driver current IDRV1 flows from the power supply node NVPI toward the control line TRGL via the driver DRVT ((A) and (B) of FIG. 9). Similarly, when the driver DRVT changes the voltage of the control signal STRG from the high level to the low level, the driver current IDRV2 flows from the control line TRGL toward the power supply node NVRL via the driver DRVT ((A) and (C) of FIG. 9).

The current circuit 40 is able to cause the compensation current IB1 having the same amount of electric charge as the driver current IDRV1 to flow ((B) and (D) of FIG. 9). The amount of electric charge related to the compensation current IB1 indicated by shading in (D) of FIG. 9 is the same as the amount of electric charge related to the driver current IDRV1 indicated by shading in (B) of FIG. 9. Similarly, the current circuit 40 is able to cause the compensation current IB2 having the same amount of electric charge as the driver current IDRV2 to flow ((C) and (E) of FIG. 9). The amount of electric charge related to the compensation current IB2 indicated by shading in (E) of FIG. 9 is the same as the amount of electric charge related to the driver current IDRV2 indicated by shading in (C) of FIG. 9. The width of a period during which the compensation currents IB1 and IB2 flow is substantially the same as the pulse width of the control signal STRG.

FIG. 10 illustrates an operation example of the current circuit 40. As the compensation current IB, the current circuit 40 causes the amount of electric charge that is the same as the amount of the electric charge flowing through the driver DRVT in a manner described below.

The driver DRVT drives the control line TRGL with use of the control signal STRG. In this example, the control signal STRG generated by the driver DRVT transitions between "−1.2 V" and "2.8 V". That is, the amplitude of the control signal STRG is "4 V". In this example, the pulse width of the control signal STRG is "400 nsec." For example, the driver current IDRV1 flows through the driver DRVT when the control signal STRG rises.

Meanwhile, the load driving section 41 (FIG. 5) of the current circuit 40 drives the control line TRGDL with use of the control signal STRGD. The load driving section 41 drives the control line TRGDL by a current supplied from the current path A, and increases the voltage of the control signal STRGD in the control line TRGDL linearly from the ground voltage. In this example, a time in which the voltage of the control signal STRGD changes from 0 V to 2 V is "400 nsec." That is, in this example, for example, the current of the constant current source CS is set in such a manner that the time in which the voltage of the control signal STRGD changes from "0 V" to "2 V" becomes substantially the same as the pulse width of the control signal STRG. In addition, in this example, the control signal STRGD thereafter becomes "2.8 V". In this case also, a driver current IDRV3 flows through the load driver DRV15 when the control signal STRGD rises.

In the current output section 43 of the current circuit 40, the current path B from the power supply node NVPI toward the power supply node NVRL is effective in the period in which the voltage of the control signal STRGD changes from "0 V" to "2 V". In addition, the current output section 43 causes the compensation current IB to flow through this current path B in this period.

Parasitic capacitance Cp of the control line TRGL driven by the driver DRVT and parasitic capacitance Cp of the control line TRGDL driven by the load driving section 41 are substantially the same as each other. Therefore, the amount of electric charge (a portion shaded with oblique lines) of the driver current IDRV3 flowing through the load driver DRV15 while the voltage of the control signal STRGD changes from "0 V" to "2 V" is half of the amount of electric charge (a portion shaded with dots) of the driver current IDRV1 flowing through the driver DRVT while the voltage of the control signal STRG changes from "−1.2 V" to "2.8 V". Accordingly, the current circuit 40 causes a current that is twice as great as the current flowing through the current path A to flow, as the compensation current IB, through the current path B from the power supply node NVPI toward the power supply node NVRL. The amount of electric charge Q of the compensation current IB indicated in FIG. 10 is equal to the amount of electric charge of the driver current IDRV1. In such a manner, it is possible to allow the amount of electric charge flowing through the driver DRVT and the amount of electric charge of the compensation current IB to be substantially the same as each other.

In particular, in the imaging device 1, the plurality of dummy pixels P2 is coupled to the control line TRGDL. Therefore, the load driven by the driver DRVT and the load driven by the current circuit 40 are substantially the same as each other. Accordingly, for example, in a case where the gate capacitance of the transistor TRG is changed by the change in temperature or variations in process, the capacitance of the load driven by the driver DRVT and the capacitance of the load driven by the current circuit 40 change in the same manner as each other. As a result, even in a case where the temperature changes or the variations in process are caused, it is possible to cause the amount of electric charge flowing through the driver DRVT and the amount of electric charge of the compensation current IB to be substantially the same as each other.

As described above, in a case of causing the compensation current IB corresponding to one driver DRVT to flow, it is possible to set the ratio between the current flowing through the current path A and the current flowing through the current path B to "1:2". Thus, for example, in a case of causing the compensation current IB corresponding to N-number of drivers DRVT to flow, it is possible to set the ratio between the current flowing through the current path A and the current flowing through the current path B to "1:2N". The current circuit 40 is able to change the ratio between the current flowing through the current path A and the current flowing through the current path B by changing the number of the transistors MP23 to be turned on among the plurality of transistors MP23 on the basis of the control signal NSH.

The control signal generator 49 generates the control signal NSH on the basis of the number of the pixel lines L to be driven. For example, in a case where the number of the pixel lines L to be driven is great, the control signal generator 49 generates the control signal NSH in such a manner that the number of the transistors MP23 to be turned on among the plurality of transistors MP23 in the current output section 43 is small. In addition, for example, in a case where the number of the pixel lines L to be driven is small, the control signal generator 49 generates the control signal NSH in such a manner that the number of the transistors MP23 to be turned on is great. Thus, in the imaging device 1, it is possible to uniformize the load current of the power supply 13 in the plurality of operation periods TA.

FIG. 11 illustrates an operation example of the current circuit 40. (A) illustrates the waveform of the control signal SSEL. (B) illustrates the waveform of the control signal SRST. (C) illustrates the waveform of the control signal STRG. (D) illustrates the waveform of the reference signal REF. (E) illustrates the waveform of the control signal DON. (F) illustrates the waveform of the control signal STRGD. (G) illustrates the waveform of the signal CMP. (H) illustrates the waveform of the signal ION. (I) illustrates the waveform of the compensation current IB1. (J) illustrates the waveform of the compensation current IB2. The respective waveforms of the control signals SSEL, SRST, and STRG illustrated in (A) to (C) of FIG. 11 are the waveforms in the accumulation start driving D1 (FIG. 8).

At a timing t71, when the horizontal period H starts, the charge pumps 13A and 13B of the power supply 13 perform the operation of generating the power supply voltages VPI and VRL in the operation period TA that starts from this timing t71.

In the accumulation start driving D1, the driving unit 12 changes the voltage of the control signal SRST from the low level to the high level at this timing t71 ((B) of FIG. 12), and the driving unit 12 changes the voltage of the control signal STRG from the low level to the high level at a timing t72 ((C) of FIG. 12). As a result, in the light-receiving pixel P1, the transistors RST and TRG are turned on, and the electric charge accumulated in the photodiode PD is discharged. Further, the driving unit 12 changes the voltage of the control signal SRST from the high level to the low level at a timing t73 ((B) of FIG. 12), and changes the voltage of the control signal STRG from the high level to the low level at a timing t74 ((C) of FIG. 12). As a result, in the light-receiving pixel P1, the transistors RST and TRG are turned off, and the accumulation period is started.

At the timing t72, the control signal generator 49 of the driving unit 12 changes the voltage of the control signal DON from the low level to the high level ((E) of FIG. 11). As a result, in the load driving section 41, the switch SW16 is turned on, and the load driver DRV15 drives the control line TRGDL by a current supplied via the current path A. Accordingly, the control signal STRGD starts to rise linearly ((F) of FIG. 11).

At this timing t72, the voltage of the control signal STRGD is lower than the voltage Vref. Therefore, the voltage of the signal CMP outputted from the comparison circuit 42 is at the high level ((G) of FIG. 11). Accordingly, the AND circuit L24 changes the voltage of the signal ION from the low level to the high level in accordance with the transition of the control signal DON ((H) of FIG. 11). Accordingly, the switch SW25 is turned on, and the current path B becomes effective. As a result, the compensation current IB corresponding to the number of the transistors MP23 set to be on by the control signal NSH flows through this current path B ((I) and (J) of FIG. 11).

Further, at a timing t75, the voltage of the control signal STRGD becomes higher than the voltage Vref ((F) of FIG.

11). Accordingly, the comparison circuit 42 changes the voltage of the signal CMP from the high level to the low level ((G) of FIG. 11). In accordance therewith, the AND circuit L24 changes the voltage of the signal ION from the high level to the low level ((H) of FIG. 11). Accordingly, the switch SW25 is turned off, and the current path B is cut off. As a result, the compensation current IB becomes "0" ((I) and (J) of FIG. 11).

Further, at a timing t76, the control signal generator 49 changes the voltage of the control signal DON from the high level to the low level ((E) of FIG. 11). Accordingly, the switch SW16 is turned off, and the current path A is cut off. In addition, the load driver DRV15 changes the voltage of the control signal STRGD to "0 V" ((F) of FIG. 11). Accordingly, the voltage of the control signal STRGD becomes lower than the voltage Vref. Therefore, the comparison circuit 42 changes the voltage of the signal CMP from the low level to the high level ((G) of FIG. 11).

Further, at this timing t76, the charge pumps 13A and 13B of the power supply 13 end the operation of generating the power supply voltages VPI and VRL. Further, the charge pump 13A performs the holding operation of holding the power supply voltage VPI in the capacitor C11, and the charge pump 13B performs the holding operation of holding the power supply voltage VRL in the capacitor C21.

As described above, in the imaging device 1, the load driving section 41 and the switch SW25 are provided. The load driving section 41 drives the plurality of dummy pixels P2. The switch SW25 allows the current path B led to the power supply node NVPI to be effective while the control signal STRGD changes by a predetermined voltage. The compensation current IB is caused to flow through this current path B. This makes it possible to uniformize the load current of the charge pump 13A in the plurality of operation periods TA. Accordingly, in the plurality of operation periods TA, it is possible to allow the power supply current IDDHCP to be more uniform, to allow the change in the power supply voltage VDDHCP of the power supply 13 to be more uniform, and to allow the change in the power supply voltage VDDHPX of the pixel array 11 to be more uniform. As a result, it is possible to improve image quality of a captured image.

Similarly, in the imaging device 1, the load driving section 41 and the switch SW25 are provided. The load driving section 41 drives the plurality of dummy pixels P2. The switch SW25 allows the current path B led to the power supply node NVRL to be effective while the control signal STRGD changes by a predetermined voltage. The compensation current IB is caused to flow through this current path B. This makes it possible to uniformize the load current of the charge pump 13B in the plurality of operation periods TA. As a result, it is possible to improve image quality of a captured image.

In addition, in the imaging device 1, the control signal generator 49 sets the current value of the compensation current IB that flows through the current path B of the current circuit 40 on the basis of the number of the pixel lines L to be driven. In other words, the control signal generator 49 sets the current value of the compensation current IB that flows through the current path B of the current circuit 40 on the basis of the number of the transistors TRG to be turned on. Thus, in the imaging device 1, it is possible to improve image quality of a captured image and to reduce the circuit area of the imaging device 1. That is, for example, in a case where the plurality of dummy pixel lines each including a plurality of dummy pixels P2 is provided and the pixel array 11 is driven in such a manner that the total value of the number of the pixels lines L to be driven and the number of the dummy pixel lines to be driven is constant, the number of the dummy pixel lines can be great. In such a case, the circuit area of the imaging device 1 can be great. In contrast, in the imaging device 1, the control signal generator 49 sets the current value of the compensation current IB that flows through the current path B of the current circuit 40 by generating the control signal NSH on the basis of the number of the pixel lines L to be driven. This makes it possible to reduce the number of the dummy pixel lines each including the plurality of dummy pixels P2. As a result, in the imaging device 1, it is possible to reduce the circuit area of the imaging device 1.

Effects

As described above, in the present embodiment, a load driving section and a switch are provided. The load driving section drives a plurality of dummy pixels. The switch allows the current path B led to a power supply node to be effective while a control signal changes by a predetermined voltage. A compensation current is caused to flow through this current path. As a result, it is possible to improve image quality of a captured image.

In the present embodiment, a current value of the compensation current that flows through the current path B of a current circuit is set on the basis of the number of pixel lines to be driven. As a result, it is possible to improve image quality of a captured image and is also possible to reduce the circuit area of an imaging device.

2. Second Embodiment

Next, a description is given of an imaging device 2 according to a second embodiment. In the present embodiment, the current circuit is able to cause a current to flow through the power supply node NVPI or the power supply node NVRL also in the operation period TB. It is to be noted that component parts substantially the same as those of the imaging device 1 according to the first embodiment described above are denoted by the same reference numerals, and descriptions thereof are omitted where appropriate.

As with the imaging device 1 (FIG. 1) according to the first embodiment described above, the imaging device 2 includes a driving unit 52 and an imaging controller 54.

FIG. 12 illustrates a configuration example of the driving unit 52. The driving unit 52 includes a current circuit 60.

As with the current circuit 40 according to the first embodiment described above, the current circuit 60 is configured to cause the compensation current IB to flow from the power supply node NVPI toward the power supply node NVRL by driving the plurality of dummy pixels P2 with use of the control signal STRGD on the basis of the control signals DON and NSH supplied from the control signal generator 49. In addition, the current circuit 60 is able to adjust the pixel voltage Vpix by causing an adjustment current to flow through the power supply node NVPI or the power supply node NVRL on the basis of control signals CW and CB supplied from the imaging controller 54.

FIG. 13 illustrates a configuration example of the current circuit 60. The current circuit 60 includes a current output section 64. The current output section 64 is configured to cause, on the basis of the signal ION, an adjustment current IC to flow from the power supply node NVPI supplied with the power supply voltage VPI toward a ground node or cause an adjustment current ID to flow from the power supply node supplied with the power supply voltage VDD toward the power supply node NVRL supplied with the power supply voltage VRL. The current output section 64 includes a plurality of transistors MP31, a switch SW32, a transistor MN33, a plurality of transistors MP35, and a switch SW36. The transistor MN33 is an N-type MOS transistor. The transistors MP31, MP34, and MP35 are P-type MOS transistors.

The plurality of transistors MP31 is configured to be individually set to be on or off on the basis of the control signal CW supplied from the imaging controller 54. The gate of each of one or more transistors MP31 set to be on is coupled to the gate and the drain of the transistor MP22 and is also coupled to the drain of the transistor MN21. The source of each of the one or more transistors MP31 set to be on is coupled to the power supply node NVPI. The drain of each of the one or more transistors MP31 set to be on is coupled to the switch SW32. The switch SW32 includes, for example, one or more MOS transistors and is configured to be turned on and off on the basis of the signal ION. One end of the switch SW32 is coupled to the drain of each of the one or more transistors MP31 set to be on among the plurality of transistors MP31. Another end of the switch SW32 is grounded. With this configuration, in the current output section 64, in a case where the voltage of the signal ION is at the low level, the switch SW32 is turned off, which cuts off a current path C from the power supply node NVPI toward the ground node. In addition, in a case where the voltage of the signal ION is at the high level, the switch SW32 is turned on, which allows the current path C from the power supply node NVPI toward the ground node to be effective. This allows the adjustment current IC corresponding to the number of the transistors MP31 set to be turned on by the control signal CW to flow through this current path C.

The gate of the transistor MN33 is coupled to the gate and the drain of the transistor MN11 and is also coupled to the constant current source CS and the respective gates of the transistors MN12 and MN21. The drain of the transistor MN33 is coupled to the gate and the drain of the transistor MP34. The source of the transistor MN33 is grounded. The gate of the transistor MP34 is coupled to the respective drains of the transistors MN33 and MP34. The source of the transistor MP34 is coupled to the power supply node supplied with the power supply voltage VDD. The drain of the transistor MP34 is coupled to the gate of the transistor MP34 and the drain of the transistor MN33. The plurality of transistors MP35 is configured to be individually set to be on or off on the basis of the control signal CB supplied from the imaging controller 54. The gate of each of one or more transistors MP35 set to be on is coupled to the gate and the drain of the transistor MP34 and is also coupled to the drain of the transistor MN33. The source of each of the one or more transistors MP35 set to be on is coupled to the power supply node supplied with the power supply voltage VDD. The drain of each of the one or more transistors MP35 set to be on is coupled to the switch SW36. The switch SW36 includes, for example, one or more MOS transistors and is configured to be turned on and off on the basis of the signal ION. One end of the switch SW36 is coupled to the drain of each of the one or more transistors MP35 set to be on among the plurality of transistors MP35. Another end of the switch SW36 is coupled to the power supply node NVRL. With this configuration, in the current output section 64, in a case where the voltage of the signal ION is at the low level, the switch SW36 is turned off, which cuts off a current path D from the power supply node supplied with the power supply voltage VDD toward the power supply node NVRL. In addition, in a case where the voltage of the signal ION is at the high level, the switch SW36 is turned on, which allows the current path D from the power supply node supplied with the power supply voltage VDD toward the power supply node NVRL to be effective. This allows the adjustment current ID corresponding to the number of the transistors MP35 set to be on by the control signal CB to flow through this current path D.

As with the imaging controller 14 according to the first embodiment described above, the imaging controller 54 (FIG. 12) is configured to control an operation of the imaging device 2 by supplying respective control signals to the driving unit 52, the power supply 13, the readout unit 20, and the signal processor 16 and control the respective operations of these circuits. In addition, the imaging controller 54 also has a function of generating the control signals CW and CB corresponding to an adjustment amount of the pixel voltage Vpix and supplying the control signals CW and CB to the current circuit 60 of the driving unit 52.

Next, a description is given of an AD conversion operation in the imaging device 2. A description is first given of a case of adjusting the pixel voltage Vpix by the adjustment current ID, and a description is given next of a case of adjusting the pixel voltage Vpix by the adjustment current IC.

FIG. 14 illustrates an operation example of the AD conversion in the case of adjusting the pixel voltage Vpix by the adjustment current ID. (A) illustrates the waveform of the control signal SSEL. (B) illustrates the waveform of the control signal SRST. (C) illustrates the waveform of the control signal STRG. (D) illustrates the waveform of the control signal AZ. (E) illustrates the waveform of the control signal DON. (F) illustrates the waveform of the control signal STRGD. (G) illustrates the waveform of an adjustment current ID2 that flows out from the current path D of the current circuit 60 to the power supply node NVRL. (H) illustrates the waveform of the power supply voltage VPI. (I) illustrates the waveform of the power supply voltage VRL. (J) illustrates the waveform of the reference signal REF. (K) illustrates the waveform of the signal SIG. In (H) and (I) of FIG. 14, the respective waveforms of the power supply voltages VPI and VRL are illustrated using the same voltage axis. In this example, the control signal NSH is a signal giving an instruction to turn off all of the plurality of transistors MP23. The control signal CW is a signal giving an instruction to turn off all of the plurality of transistors MP31. In addition, the control signal CB is a signal giving an instruction to turn on some transistors MP35 among the plurality of transistors MP35.

As with the case of the first embodiment described above (FIG. 7), the charge pumps 13A and 13B of the power supply 13 perform the generation operation of generating the power supply voltages VPI and VRL in a period from a timing t81 to a timing t83 (the operation period TA), and perform the holding operation of holding the power supply voltages VPI and VRL in a period at and after the timing t83 (the operation period TB). In addition, the light-receiving pixel P1 performs the reset operation on the basis of the control signal SRST in a period from the timing t81 to a timing t82. In addition, the comparison circuit 24 of the AD converter ADC sets an operating point in a period from the timing t81 to a timing t84.

Further, the AD converter ADC performs the AD conversion on the basis of the signal SIG (the reset voltage Vreset) in a period (the P-phase period TP) from a timing t85 to a timing t87. The AD converter ADC thus obtains the count value CNTP corresponding to the reset voltage Vreset.

Further, the light-receiving pixel P1 performs the electric charge transfer operation on the basis of the control signal STRG in a period from a timing t89 to a timing t90. In the light-receiving pixel P1, the electric charge generated in the photodiode PD is thereby transferred to the floating diffusion FD.

At the timing t89, the control signal generator 49 of the driving unit 52 changes the voltage of the control signal DON from the low level to the high level ((E) of FIG. 14). Accordingly, in the load driving section 41, the switch SW16 is turned on, and the load driver DRV15 drives the control line TRGDL by a current supplied via the current path A. As a result, the control signal STRGD starts to rise linearly ((F) of FIG. 14).

Further, in a period from this timing t89 to the timing t90 at which the control signal STRGD reaches the voltage Vref, the voltage of the signal ION outputted from the AND circuit L24 changes to the high level, the switch SW36 is turned on, and the current path D becomes effective. As a result, the adjustment current ID (the adjustment current ID2) corresponding to the number of the transistors MP35 set to be on by the control signal CB flows through this current path D ((G) of FIG. 14). This adjustment current ID flows out from the current path D to the power supply node NVRL. Because the charge pump 13B is performing the operation of holding the power supply voltage VRL in the capacitor C21, the power supply voltage VRL is increased linearly by this adjustment current ID in this period from the timing t89 to the timing t90 ((I) of FIG. 14). Further, at and after the timing t90, this power supply voltage VRL is held. As illustrated in FIG. 15, the greater the magnitude of the adjustment current ID is, the greater the amount by which the power supply voltage VRL increases is.

At the timing t90, the driving unit 52 changes the voltage of the control signal STRG from the high level to the low level ((C) of FIG. 14). Because the driver DRVT of the driving unit 52 generates the control signal STRG on the basis of the power supply voltage VRL, a low-level voltage of this control signal STRG becomes slightly higher than a low-level voltage in a period before the timing t89. In the light-receiving pixel P1, the voltage in the floating diffusion FD changes in accordance with a change in the low-level voltage of the control signal STRG.

FIG. 16 illustrates an example of parasitic capacitance in the light-receiving pixel P1. When the voltage of the gate of the transistor TRG changes, the change in the voltage is transferred to the floating diffusion FD via the parasitic capacitance between the gate and the drain of the transistor TRG. In this example, an increase in the voltage of the gate of the transistor TRG increases the voltage of the floating diffusion FD. As a result, as illustrated in (K) of FIG. 14, the voltage (the pixel voltage Vpix) of the signal SIG increases.

Further, at a timing t91, the control signal generator 49 changes the voltage of the control signal DON from the high level to the low level ((E) of FIG. 14). As a result, the switch SW16 is turned off, and the current path A is cut off. Further, the load driver DRV15 sets the voltage of the control signal STRGD to "0 V" ((F) of FIG. 14).

Further, in a period (the D-phase period TD) from a timing t92 to a timing t94, the AD converter ADC performs the AD conversion on the basis of the signal SIG (the pixel voltage Vpix). The AD converter ADC thus obtains the count value CNTD corresponding to the pixel voltage Vpix. Because the pixel voltage Vpix is increased in accordance with the adjustment current ID, the count value CNTD is slightly smaller as compared with a case where the adjustment current ID is not caused to flow.

The signal processor 16 generates the pixel value VAL, for example, by subtracting the count value CNTP from the count value CNTD. The pixel value VAL is thus adjusted by the adjustment current ID in such a manner as to be closer to a so-called black level.

Here, the transistor TRG corresponds to a specific example of the "pixel transistor" and the "transfer transistor" in the present disclosure. The power supply node NVRL corresponds to a specific example of the "first power supply node" in the present disclosure. The driver DRVT corresponds to a specific example of the "driver" in the present disclosure. The current circuit 60 corresponds to a specific example of the "current circuit" in the present disclosure. The current path D corresponds to a specific example of the "current path" in the present disclosure. The switch SW36 corresponds to a specific example of the "switch" in the present disclosure. The imaging controller 54 corresponds to a specific example of a "second current controller" in the present disclosure.

FIG. 17 illustrates an operation example of the AD conversion in a case of adjusting the pixel voltage Vpix by the adjustment current IC. (A) illustrates the waveform of the control signal SSEL. (B) illustrates the waveform of the control signal SRST. (C) illustrates the waveform of the control signal STRG. (D) illustrates the waveform of the control signal AZ. (E) illustrates the waveform of the control signal DON. (F) illustrates the waveform of the control signal STRGD. (G) illustrates the waveform of the adjustment current IC1 that flows into the current path C of the current circuit 60 from the power supply node NVPI. (H) illustrates the waveform of the power supply voltage VPI. (I) illustrates the waveform of the power supply voltage VRL. (J) illustrates the waveform of the reference signal REF. (K) illustrates the waveform of the signal SIG. In this example, the control signal NSH is a signal that gives an instruction to turn off all of the plurality of transistors MP23, and the control signal CB is a signal that gives an instruction to turn off all of the plurality of transistors MP35. In addition, the control signal CW is a signal that gives an instruction to turn on some transistors MP31 among the plurality of transistors MP31.

As with the case of adjusting the pixel voltage Vpix by the adjustment current ID (FIG. 14), the charge pumps 13A and 13B of the power supply 13 perform the generation operation of generating the power supply voltages VPI and VRL in a period (the operation period TA) from a timing t81 to a timing t83, and perform the holding operation of holding the power supply voltages VPI and VRL in a period (the operation period TB) at and after the timing t83. In addition, the light-receiving pixel P1 performs the reset operation on the basis of the control signal SRST in a period from the timing t81 to a timing t82. In addition, the comparison circuit 24 of the AD converter ADC sets an operating point in a period from the timing t81 to a timing t84.

Further, the AD converter ADC performs the AD conversion on the basis of the signal SIG (the reset voltage Vreset) in a period (the P-phase period TP) from a timing t85 to a timing t87. The AD converter ADC thus obtains the count value CNTP corresponding to the reset voltage Vreset.

Further, the light-receiving pixel P1 performs the electric charge transfer operation on the basis of the control signal STRG in a period from a timing t89 to a timing t90. Accordingly, in the light-receiving pixel P1, the electric charge generated in the photodiode PD is transferred to the floating diffusion FD.

At the timing t89, the control signal generator 49 of the driving unit 52 changes the voltage of the control signal DON from the low level to the high level ((E) of FIG. 17). Accordingly, in the load driving section 41, the switch SW16 is turned on, and the load driver DRV15 drives the control line TRGDL by the current supplied via the current path A. As a result, the control signal STRGD starts to rise linearly ((F) of FIG. 17).

Further, in a period from this timing t89 to the timing t90 at which the control signal STRGD reaches the voltage Vref, the voltage of the signal ION outputted from the AND circuit L24 changes to the high level, the switch SW32 is turned on, and the current path C becomes effective. As a result, the adjustment current IC (the adjustment current IC1) corresponding to the number of the transistors MP31 set to be on by the control signal CW flows through this current path C ((G) of FIG. 17). This adjustment current IC flows into the current path C from the power supply node NVPI. Because the charge pump 13A is performing the operation of holding the power supply voltage VPI in the capacitor C11, the power supply voltage VPI is decreased linearly by this adjustment current IC in this period from the timing t89 to the timing t90 ((H) of FIG. 17). Further, at and after the timing t90, this power supply voltage VPI is held. As illustrated in FIG. 18, the greater the magnitude of the adjustment current IC is, the greater the amount by which the power supply voltage VPI decreases is.

Because the driver DRVS of the driving unit 52 generates the control signal SSEL on the basis of the power supply voltage VPI, a high-level voltage of this control signal SSEL is decreased linearly in the period from the timing t89 to the timing t90 and is maintained at and after the timing t90 ((A) of FIG. 17). The high-level voltage of this control signal SSEL is slightly lower than the high-level voltage in a period before the timing t89. In the light-receiving pixel P1, the voltage in the floating diffusion FD changes in accordance with such a change in the high-level voltage of the control signal SSEL.

FIG. 19 illustrates an example of parasitic capacitance in the light-receiving pixel P1. When the voltage of the gate of the transistor SEL changes, the change in the voltage is transferred to the floating diffusion FD via the parasitic capacitance between the gate and the drain of the transistor SEL and the parasitic capacitance between the gate and the source of the transistor AMP. In this example, a decrease in the voltage of the gate of the transistor SEL decreases the voltage of the floating diffusion FD. As a result, as illustrated in (K) of FIG. 17, the voltage (the pixel voltage Vpix) of the signal SIG decreases.

Further, at a timing t91, the control signal generator 49 changes the voltage of the control signal DON from the high level to the low level ((E) of FIG. 17). As a result, the switch SW16 is turned off, and the current path A is cut off. Further, the load driver DRV15 sets the voltage of the control signal STRGD to "0 V" ((F) of FIG. 17).

Further, in a period (the D-phase period TD) from a timing t92 to a timing t94, the AD converter ADC performs the AD conversion on the basis of the signal SIG (the pixel voltage Vpix). The AD converter ADC thus obtains the count value CNTD corresponding to the pixel voltage Vpix. Because the pixel voltage Vpix is decreased in accordance with the adjustment current IC, the count value CNTD is slightly greater as compared with a case where the adjustment current IC is not caused to flow.

The signal processor 16 generates the pixel value VAL, for example, by subtracting the count value CNTP from the count value CNTD. The pixel value VAL is thus adjusted by the adjustment current IC in such a manner as to be closer to a so-called white level.

Here, the transistor SEL corresponds to a specific example of the "pixel transistor" and the "output transistor" in the present disclosure. The transistor TRG corresponds to a specific example of the "transfer transistor" in the present disclosure. The power supply node NVPI corresponds to a specific example of the "first power supply node" in the present disclosure. The driver DRVS corresponds to a specific example of the "driver" in the present disclosure. The current path C corresponds to a specific example of the "current path" in the present disclosure. The switch SW32 corresponds to a specific example of the "switch" in the present disclosure. The imaging controller 54 corresponds to a specific example of the "second current controller" in the present disclosure.

As described above, in the imaging device 2, the load driving section 41 and the switch SW32 are provided. The load driving section 41 drives the plurality of dummy pixels P2. The switch SW32 allows the current path C led to the power supply node NVPI to be effective while the control signal STRGD changes by a predetermined voltage. The adjustment current IC is caused to flow through this current path C. Accordingly, in the imaging device 2, it is possible to adjust the pixel value VAL to be closer to the so-called white level. In the imaging device 2, because it is possible to adjust image quality of a captured image in such a manner, it is possible to improve image quality.

In addition, in the imaging device 2, the load driving section 41 and the switch SW36 are provided. The load driving section 41 drives the plurality of dummy pixels P2. The switch SW36 allows the current path D led to the power supply node NVRL to be effective while the control signal STRGD changes by a predetermined voltage. The adjustment current ID is caused to flow through this current path D. Accordingly, in the imaging device 2, it is possible to adjust the pixel value VAL to be closer to the so-called black level. In the imaging device 2, because it is possible to adjust image quality of a captured image in such a manner, it is possible to improve image quality.

As described above, in the present embodiment, a load driving section and a switch are provided. The load driving section drives a plurality of dummy pixels. The switch allows the current path C led to the power supply node NVPI to be effective while a control signal changes by a predetermined voltage. An adjustment current is caused to flow through this current path C. As a result, it is possible to improve image quality of a captured image.

In the present embodiment, a load driving section and a switch are provided. The load driving section drives a plurality of dummy pixels. The switch allows the current path D led to the power supply node NVRL to be effective while a control signal changes by a predetermined voltage. The adjustment current is caused to flow through this current path D. As a result, it is possible to improve image quality of a captured image.

Modification 2-1

In the embodiments described above, the charge pump 13B of the power supply 13 generates one power supply voltage VRL; however, this is non-limiting. Alternatively, a plurality of power supply voltages may be generated. In the following, a detailed description is given of an imaging device 2A according to the present modification. The imaging device 2A includes a driving unit 72 and a power supply 73.

FIG. 20 illustrates a configuration example of the power supply 73 and the driving unit 72.

The power supply 73 includes a charge pump 73B. The charge pump 73B is configured to generate power supply voltages VRL and VRLRD on the basis of an instruction from the imaging controller 54. The power supply voltage VRLRD has the same voltage as the power supply voltage VRL. The power supply voltage VRLRD is a voltage to be used in relation to the pixel line L to be subjected to the AD conversion. In the operation period TA, the charge pump 73B performs the generation operation of generating the power supply voltage VRL by charging electric charge to the capacitor C21 coupled to the terminal T21, and also performs a generation operation of generating the power supply voltage VRLRD by charging electric charge to a capacitor C22 coupled to a terminal T22. Further, in the operation period TB, the charge pump 73B performs the holding operation of holding the power supply voltage VRL in the capacitor C21 and also performs a holding operation of holding the power supply voltage VRLRD in the capacitor C22. The charge pump 73B is configured to generate the power supply voltages VRL and VRLRD by repeating these operations. Further, the charge pump 73B supplies the generated power supply voltage VRL to the driving unit 72 via the power supply node NVRL, and supplies the generated power supply voltage VRLRD to the driving unit 72 via a power supply node NVRLRD.

The driving unit 72 includes a plurality of switches SWT, a current circuit 60A, and a control signal generator 79. FIG. 20 illustrates a switch $SWT_n$ related to the n-th pixel line L in the light-receiving pixel region R1.

The plurality of switches SWT is provided in association with the plurality of respective drivers DRVT. Each of the plurality of switches SWT is configured to selectively supply the power supply voltage VRL or the power supply voltage VRLRD to the associated driver DRVT on the basis of the control signal supplied from the control signal generator 79. Specifically, in a case of causing the signal SIG to be outputted to the plurality of light-receiving pixels P1 related to the n-th pixel line L, the switch $SWT_n$ supplies the power supply voltage VRLRD to the driver $DRVT_n$ on the basis of the control signal supplied from the control signal generator 79. In a case of not causing the signal SIG to be outputted to the plurality of light-receiving pixels P1 related to the n-th pixel line L, the switch $SWT_n$ supplies the power supply voltage VRL to the driver $DRVT_n$ on the basis of the control signal supplied from the control signal generator 79.

As with the current circuit 60 (FIG. 13) according to the second embodiment, the current circuit 60A is configured to cause the compensation current IB to flow from the power supply node NVPI toward the power supply node NVRL by driving the plurality of dummy pixels P2 with use of the control signal STRGD on the basis of the control signals DON and NSH supplied from the control signal generator 79. In addition, the current circuit 60A is able to adjust the pixel voltage Vpix by causing the adjustment current to flow through the power supply node NVPI or the power supply node NVRLRD on the basis of the control signals CW and CB supplied from the imaging controller 54.

FIG. 21 illustrates a configuration example of the current circuit 60A. The current circuit 60A includes a current output section 64A. In the current output section 64A, one end of the switch SW36 is coupled to the drain of each of the one or more transistors MP35 set to be on among the plurality of transistors MP35, and another end thereof is coupled to the power supply node NVRLRD.

The control signal generator 79 (FIG. 20) is configured to control operations of the plurality of drivers DRVT, the plurality of switches SWT, the plurality of drivers DRVR, and the plurality of drivers DRVS on the basis of an instruction given from the imaging controller 54.

Modification 2-2

In the embodiments described above, the charge pump 13A of the power supply 13 generates one power supply voltage VPI; however, this is non-limiting. Alternatively, a plurality of power supply voltages may be generated. In the following, a detailed description is given of an imaging device 2B according to the present modification. The imaging device 2B is an application of the present modification to the imaging device 2A according to the above-described modification. The imaging device 2B includes a driving unit 82 and a power supply 83.

FIG. 22 illustrates a configuration example of the power supply 83 and the driving unit 82.

The power supply 83 includes a charge pump 83A. The charge pump 83A is configured to generate power supply voltages VPI and VPISD on the basis of an instruction from the imaging controller 54. The power supply voltage VPISD has the same voltage as the power supply voltage VPI. The power supply voltage VPISD is a voltage to be used in relation to the pixel line L to be subjected to the AD conversion. In the operation period TA, the charge pump 83A performs the generation operation of generating the power supply voltage VPI by charging electric charge to the capacitor C11 coupled to the terminal T11, and also performs a generation operation of generating the power supply voltage VPISD by charging electric charge to a capacitor C12 coupled to a terminal T12. Further, in the operation period TB, the charge pump 83A performs the holding operation of holding the power supply voltage VPI in the capacitor C11 and also performs a holding operation of holding the power supply voltage VPISD in the capacitor C12. The charge pump 83A is configured to generate the power supply voltages VPI and VPISD by repeating these operations. Further, the charge pump 83A supplies the generated power supply voltage VPI to the driving unit 82 via the power supply node NVPI, and supplies the generated power supply voltage VPISD to the driving unit 82 via a power supply node NVPISD.

The driving unit 82 includes a plurality of switches SWS, a current circuit 60B, and a control signal generator 89. FIG. 22 illustrates a switch $SWS_n$ related to the n-th pixel line L in the light-receiving pixel region R1.

The plurality of switches SWS is provided in association with the plurality of respective drivers DRVS. Each of the plurality of switches SWS is configured to selectively supply the power supply voltage VPI or the power supply voltage VPISD to the associated driver DRVS on the basis of the control signal supplied from the control signal generator 89. Specifically, in a case of causing the signal SIG to be outputted to the plurality of light-receiving pixels P1 related to the n-th pixel line L, the switch $SWS_n$ supplies the power supply voltage VPISD to the driver $DRVS_n$ on the basis of the control signal supplied from the control signal generator 89. In a case of not causing the signal SIG to be outputted to the plurality of light-receiving pixels P1 related to the n-th pixel line L, the switch $SWS_n$ supplies the power supply voltage VPI to the driver $DRVS_n$ on the basis of the control signal supplied from the control signal generator 89.

As with the current circuit 60A according to the above-described modification, the current circuit 60B is configured to cause the compensation current IB to flow from the power supply node NVPI toward the power supply node NVRL by driving the plurality of dummy pixels P2 with use of the control signal STRGD on the basis of the control signals DON and NSH supplied from the control signal generator 89. In addition, the current circuit 60B is able to adjust the pixel voltage Vpix by causing the adjustment current to flow through the power supply node NVPISD or the power supply node NVRLRD on the basis of the control signals CW and CB supplied from the imaging controller 54.

FIG. 23 illustrates a configuration example of the current circuit 60B. The current circuit 60B includes a current output section 64B. In the current output section 64B, the source of each of the one or more transistors MP31 set to be on is coupled to the power supply node NVPISD and the drain thereof is coupled to the switch SW32.

The control signal generator 89 (FIG. 22) is configured to control operations of the plurality of drivers DRVT, the plurality of switches SWT, the plurality of drivers DRVR, the plurality of switches SWS, and the plurality of drivers DRVS on the basis of an instruction from the imaging controller 54.

3. Usage Example of Imaging Device

FIG. 24 illustrates a usage example of the imaging device 1 according to the embodiment described above. For example, the imaging device 1 described above is usable in a variety of cases of sensing light such as visible light, infrared light, ultraviolet light, and X-rays as follows.

- Devices that shoot images for viewing such as digital cameras and mobile devices having a camera function
- Devices for traffic use such as onboard sensors that shoot images of the front, back, surroundings, inside, and so on of an automobile for safe driving such as automatic stop and for recognition of a driver's state, monitoring cameras that monitor traveling vehicles and roads, and distance measurement sensors that measure vehicle-to-vehicle distance
- Devices for use in home electrical appliances such as televisions, refrigerators, and air-conditioners to shoot images of a user's gesture and bring the appliances into operation in accordance with the gesture
- Devices for medical care and health care use such as endoscopes and devices that shoot images of blood vessels by receiving infrared light
- Devices for security use such as monitoring cameras for crime prevention and cameras for individual authentication
- Devices for beauty use such as skin measurement devices that shoot images of skin and microscopes that shoot images of scalp
- Devices for sports use such as action cameras and wearable cameras for sports applications and the like
- Devices for agricultural use such as cameras for monitoring the states of fields and crops

4. Example of Application to Mobile Body

The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

FIG. 25 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 25, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 25, an audio speaker 12061, a display section 12062, and an instrument panel 12063 are illustrated as the output device. The display section 12062 may, for example, include at least one of an on-board display and a head-up display.

FIG. 26 is a diagram depicting an example of the installation position of the imaging section 12031.

In FIG. 26, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 26 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the vehicle control system to which the technology according to the present disclosure is applicable has been described above. The technology according to the present disclosure is applicable to the imaging section 12031 among the configurations described above. Accordingly, in the vehicle control system 12000, it is possible to improve image quality of a captured image obtained by the imaging section 12031. As a result, in the vehicle control system 12000, it is possible to achieve, with high accuracy, functions of collision avoidance or collision mitigation for the vehicle, a function of following driving based on a following distance, a function of vehicle speed maintaining driving, a function of warning of collision of the vehicle, a function of warning of deviation of the vehicle from a lane, or the like.

Although the present technology has been described with reference to the embodiments, the modifications, and specific application examples thereof, the present technology is not limited to the embodiments and the like. The present technology is modifiable in a variety of ways.

For example, in the embodiments described above, the light-receiving pixel P1 having the configuration as illustrated in FIG. 2 and the dummy pixel P2 having the configuration as illustrated in FIG. 3 are used; however, this is non-limiting. It is possible to use light-receiving pixels and dummy pixels having a variety of configurations.

It is to be noted that the effects described in the present specification are merely illustrative and nom-limiting. In addition, other effects may be achieved.

It is to be noted that the present technology may be configured as below. The present technology having the following configurations makes it possible to improve image quality of a captured image.

(1)

An imaging device including:
 a light-receiving pixel including a light-receiving element and a pixel transistor, the light-receiving element generating electric charge corresponding to an amount of received light;
 a power supply that generates a first power supply voltage at a first power supply node;
 a driver that drives the pixel transistor on the basis of the first power supply voltage at the first power supply node; and
 a current circuit that causes a power supply current to flow through a current path led to the first power supply node, the power supply current having a predetermined current value, in which
 the current circuit includes
  a load,
  a load driving section that drives the load, and
  a switch that is provided on the current path, the switch allowing the power supply current to flow through the current path by being turned on in a period in which a voltage in the load changes by a predetermined voltage.

(2)

The imaging device according to (1), in which the load driving section includes a constant current source, and drives the load by a current generated by the constant current source.

(3)

The imaging device according to (2), in which
 the load driving section starts to change the voltage in the load from a first voltage by starting to drive the load by the current at a first timing, the current being generated by the constant current source, and
 the switch is turned on at the first timing and is turned off at a second timing at which the voltage in the load reaches a second voltage, the second voltage being different from the first voltage by the predetermined voltage.

(4)

The imaging device according to any one of (1) to (3), in which the current circuit is configured to change the predetermined current value.

(5)

The imaging device according to any one of (1) to (4), in which the load includes a load transistor that has a same configuration as the pixel transistor.

(6)

The imaging device according to any one of (1) to (5), in which the load includes a dummy pixel that has a same configuration as at least a portion of the light-receiving pixel.

(7)

The imaging device according to any one of (1) to (6), in which the power supply further generates a second power supply voltage at a second power supply node,
 the driver drives the pixel transistor on the basis of the first power supply voltage at the first power supply node and the second power supply voltage at the second power supply node,
 the current path is further led to the second power supply node, and
 the current circuit causes the power supply current to flow between the first power supply node and the second power supply node by the switch being turned on.

(8)

The imaging device according to (7), including:
 a plurality of the light-receiving pixels;
 a plurality of the drivers that is provided in association with the respective pixel transistors of the plurality of light-receiving pixels and drives the respective pixel transistors associated therewith; and
 a first current controller that sets the predetermined current value on the basis of number of the pixel transistors to be turned on among the plurality of pixel transistors.

(9)

The imaging device according to (8), in which at least a portion of a period in which the switch is turned on overlaps with a period in which the pixel transistor that is to be turned on among the plurality of pixel transistors is turned on.

(10)

The imaging device according to (7) or (8), in which
 the light-receiving pixel includes
  an accumulation element that accumulates the electric charge generated by the light-receiving element, a transfer transistor having a gate, the transfer transistor transferring the electric charge generated by the light-receiving element to the accumulation element by being turned on, a reset transistor having a gate, the reset transistor supplying a third voltage to the accumulation element by being turned on, and an output transistor having a gate, the output transistor outputting a voltage corresponding to a voltage in the accumulation element by being turned on, in which the pixel transistor includes the transfer transistor, and the driver drives the pixel transistor by causing a voltage of the gate of the pixel transistor to transition between the first power supply voltage and the second power supply voltage.

(11)

The imaging device according to (10), in which the transfer transistor and the reset transistor are on and the output transistor is off in a first period, the transfer transistor, the reset transistor, and the output transistor are off in a second period after the first period, the output transistor is on in a third period after the second period, and at least a portion of a period in which the switch is turned on overlaps with the first period.

(12)

The imaging device according to any one of (7) to (12), in which the power supply performs a first operation in a first operation period, the first operation being an operation of generating the first power supply voltage at the first power supply node and generating the second power supply voltage at the second power supply node, the power supply performs a second operation in a second operation period, the second operation being an operation of stopping generation of the first power supply voltage and the second power supply voltage and holding a voltage at the first power supply node and a voltage at the second power supply node, and a period in which the switch is turned on belongs to the first operation period.

(13)

The imaging device according to any one of (1) to (6), further including a second current controller that sets the predetermined current value, in which the current path is further led to a third power supply node, and the current circuit causes the power supply current having the predetermined current value to flow between the first power supply node and the third power supply node by the switch being turned on.

(14)

The imaging device according to (13), in which the light-receiving pixel includes an accumulation element that accumulates the electric charge generated by the light-receiving element, a transfer transistor having a gate, the transfer transistor transferring the electric charge generated by the light-receiving element to the accumulation element by being turned on, a reset transistor having a gate, the reset transistor supplying a third voltage to the accumulation element by being turned on, and an output transistor having a gate, the output transistor outputting a voltage corresponding to a voltage in the accumulation element by being turned on, the pixel transistor includes the transfer transistor, the driver drives the pixel transistor by causing a voltage of the gate of the pixel transistor to transition between the first power supply voltage and the second power supply voltage, and the first power supply voltage is a voltage to turn off the pixel transistor.

(15)

The imaging device according to (13), in which the light-receiving pixel includes an accumulation element that accumulates the electric charge generated by the light-receiving element, a transfer transistor having a gate, the transfer transistor transferring the electric charge generated by the light-receiving element to the accumulation element by being turned on, a reset transistor having a gate, the reset transistor supplying a third voltage to the accumulation element by being turned on, and an output transistor having a gate, the output transistor outputting a voltage corresponding to a voltage in the accumulation element by being turned on, the pixel transistor includes the output transistor, the driver drives the pixel transistor by causing a voltage of the gate of the pixel transistor to transition between the first power supply voltage and a third power supply voltage, and the first power supply voltage is a voltage to turn on the pixel transistor.

(16)

The imaging device according to (14) or (15), in which the transfer transistor and the reset transistor are on and the output transistor is off in a first period, the transfer transistor, the reset transistor, and the output transistor are off in a second period after the first period, the output transistor is on in a third period after the second period, the reset transistor is on and the transfer transistor is off in a first sub-period in the third period, the reset transistor and the transfer transistor are off in a second sub-period after the first sub-period in the third period, the transfer transistor is on and the reset transistor is off in a third-sub period after the second sub-period in the third period, the transfer transistor and the reset transistor are off in a fourth sub-period after the third sub-period in the third period, and at least a portion of a period in which the switch is turned on overlaps with the third sub-period.

(17)

The imaging device according to any one of (13) to (16), in which the power supply performs a first operation in a first operation period, the first operation being an operation of generating the first power supply voltage at the first power supply node, the power supply performs a second operation in a second operation period, the second operation being an operation of stopping generation of the first power supply voltage and holding a voltage at the first power supply node, and a period in which the switch is turned on belongs to the second operation period.

(18)

A method of driving an imaging device, the method including:
generating a first power supply voltage at a first power supply node;
driving a pixel transistor of a light-receiving pixel on the basis of the first power supply voltage at the first power supply node, the light-receiving pixel including a light-receiving element and the pixel transistor, the light-receiving element generating electric charge corresponding to an amount of received light;
driving a load; and
causing a power supply current to flow through a current path by turning on a switch provided on the current path in a period in which a voltage in the load changes by a predetermined voltage, the power supply current having a predetermined current value, the current path being led to the first power supply node.

This application claims the priority on the basis of Japanese Patent Application No. 2020-126719 filed on Jul. 27, 2020 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device comprising:
a light-receiving pixel including a light-receiving element and a pixel transistor, the light-receiving element generating electric charge corresponding to an amount of received light;
a power supply that generates a first power supply voltage at a first power supply node;
a driver that drives the pixel transistor on a basis of the first power supply voltage at the first power supply node; and
a current circuit that causes a power supply current to flow through a current path led to the first power supply node, the power supply current having a predetermined current value, wherein
the current circuit includes
a load,
a load driving section that drives the load, and
a switch that is provided on the current path, the switch allowing the power supply current to flow through the current path by being turned on in a period in which a voltage in the load changes by a predetermined voltage.

2. The imaging device according to claim 1, wherein the load driving section includes a constant current source, and drives the load by a current generated by the constant current source.

3. The imaging device according to claim 2, wherein
the load driving section starts to change the voltage in the load from a first voltage by starting to drive the load by the current at a first timing, the current being generated by the constant current source, and
the switch is turned on at the first timing and is turned off at a second timing at which the voltage in the load reaches a second voltage, the second voltage being different from the first voltage by the predetermined voltage.

4. The imaging device according to claim 1, wherein the current circuit is configured to change the predetermined current value.

5. The imaging device according to claim 1, wherein the load includes a load transistor that has a same configuration as the pixel transistor.

6. The imaging device according to claim 1, wherein the load includes a dummy pixel that has a same configuration as at least a portion of the light-receiving pixel.

7. The imaging device according to claim 1, wherein
the power supply further generates a second power supply voltage at a second power supply node,
the driver drives the pixel transistor on a basis of the first power supply voltage at the first power supply node and the second power supply voltage at the second power supply node,
the current path is further led to the second power supply node, and
the current circuit causes the power supply current to flow between the first power supply node and the second power supply node by the switch being turned on.

8. The imaging device according to claim 7, comprising:
a plurality of the light-receiving pixels;
a plurality of the drivers that is provided in association with the respective pixel transistors of the plurality of light-receiving pixels and drives the respective pixel transistors associated therewith; and
a first current controller that sets the predetermined current value on a basis of number of the pixel transistors to be turned on among the plurality of pixel transistors.

9. The imaging device according to claim 8, wherein at least a portion of a period in which the switch is turned on overlaps with a period in which the pixel transistor that is to be turned on among the plurality of pixel transistors is turned on.

10. The imaging device according to claim 7, wherein
the light-receiving pixel includes
an accumulation element that accumulates the electric charge generated by the light-receiving element,
a transfer transistor having a gate, the transfer transistor transferring the electric charge generated by the light-receiving element to the accumulation element by being turned on,
a reset transistor having a gate, the reset transistor supplying a third voltage to the accumulation element by being turned on, and
an output transistor having a gate, the output transistor outputting a voltage corresponding to a voltage in the accumulation element by being turned on, wherein
the pixel transistor comprises the transfer transistor, and
the driver drives the pixel transistor by causing a voltage of the gate of the pixel transistor to transition between the first power supply voltage and the second power supply voltage.

11. The imaging device according to claim 10, wherein
the transfer transistor and the reset transistor are on and the output transistor is off in a first period,
the transfer transistor, the reset transistor, and the output transistor are off in a second period after the first period,
the output transistor is on in a third period after the second period, and
at least a portion of a period in which the switch is turned on overlaps with the first period.

12. The imaging device according to claim 7, wherein
the power supply performs a first operation in a first operation period, the first operation being an operation of generating the first power supply voltage at the first power supply node and generating the second power supply voltage at the second power supply node, the power supply performs a second operation in a second operation period, the second operation being an operation of stopping generation of the first power supply voltage and the second power supply voltage and holding a voltage at the first power supply node and a voltage at the second power supply node, and a period in which the switch is turned on belongs to the first operation period.

13. The imaging device according to claim 7, further comprising
a second current controller that sets the predetermined current value, wherein
the current path is further led to a third power supply node, and
the current circuit causes the power supply current having the predetermined current value to flow between the first power supply node and the third power supply node by the switch being turned on.

14. The imaging device according to claim 13, wherein the light-receiving pixel includes
an accumulation element that accumulates the electric charge generated by the light-receiving element,
a transfer transistor having a gate, the transfer transistor transferring the electric charge generated by the light-receiving element to the accumulation element by being turned on,
a reset transistor having a gate, the reset transistor supplying a third voltage to the accumulation element by being turned on, and
an output transistor having a gate, the output transistor outputting a voltage corresponding to a voltage in the accumulation element by being turned on,
the pixel transistor comprises the transfer transistor,
the driver drives the pixel transistor by causing a voltage of the gate of the pixel transistor to transition between the first power supply voltage and the second power supply voltage, and
the first power supply voltage is a voltage to turn off the pixel transistor.

15. The imaging device according to claim 13, wherein the light-receiving pixel includes
an accumulation element that accumulates the electric charge generated by the light-receiving element,
a transfer transistor having a gate, the transfer transistor transferring the electric charge generated by the light-receiving element to the accumulation element by being turned on,
a reset transistor having a gate, the reset transistor supplying a third voltage to the accumulation element by being turned on, and
an output transistor having a gate, the output transistor outputting a voltage corresponding to a voltage in the accumulation element by being turned on,
the pixel transistor comprises the output transistor,
the driver drives the pixel transistor by causing a voltage of the gate of the pixel transistor to transition between the first power supply voltage and a third power supply voltage, and
the first power supply voltage is a voltage to turn on the pixel transistor.

16. The imaging device according to claim 14, wherein
the transfer transistor and the reset transistor are on and the output transistor is off in a first period,
the transfer transistor, the reset transistor, and the output transistor are off in a second period after the first period,
the output transistor is on in a third period after the second period,
the reset transistor is on and the transfer transistor is off in a first sub-period in the third period,
the reset transistor and the transfer transistor are off in a second sub-period after the first sub-period in the third period,
the transfer transistor is on and the reset transistor is off in a third-sub period after the second sub-period in the third period,
the transfer transistor and the reset transistor are off in a fourth sub-period after the third sub-period in the third period, and
at least a portion of a period in which the switch is turned on overlaps with the third sub-period.

17. The imaging device according to claim 13, wherein
the power supply performs a first operation in a first operation period, the first operation being an operation of generating the first power supply voltage at the first power supply node,
the power supply performs a second operation in a second operation period, the second operation being an operation of stopping generation of the first power supply voltage and holding a voltage at the first power supply node, and
a period in which the switch is turned on belongs to the second operation period.

18. A method of driving an imaging device, the method comprising:
generating a first power supply voltage at a first power supply node;
driving a pixel transistor of a light-receiving pixel on a basis of the first power supply voltage at the first power supply node, the light-receiving pixel including a light-receiving element and the pixel transistor, the light-receiving element generating electric charge corresponding to an amount of received light;
driving a load; and
causing a power supply current to flow through a current path by turning on a switch provided on the current path in a period in which a voltage in the load changes by a predetermined voltage, the power supply current having a predetermined current value, the current path being led to the first power supply node.

* * * * *